(12) United States Patent
Yamauchi

(10) Patent No.: US 11,050,329 B2
(45) Date of Patent: Jun. 29, 2021

(54) METHOD FOR MANUFACTURING A WINDING CORE

(71) Applicant: Murata Manufacturing Co., Ltd., Kyoto-fu (JP)

(72) Inventor: Eiji Yamauchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/208,409

(22) Filed: Dec. 3, 2018

(65) Prior Publication Data
US 2019/0199182 A1  Jun. 27, 2019

(30) Foreign Application Priority Data
Dec. 26, 2017 (JP) .............................. JP2017-249004

(51) Int. Cl.
*H01F 41/02* (2006.01)
*H01F 41/34* (2006.01)
(Continued)

(52) U.S. Cl.
CPC ......... *H02K 15/0428* (2013.01); *H01F 17/03* (2013.01); *H01F 17/045* (2013.01);
(Continued)

(58) Field of Classification Search
CPC ...... H01F 27/26; H01F 27/266; H01F 27/292; H01F 17/03; H01F 17/045; H01F 41/34;
(Continued)

(56) References Cited

U.S. PATENT DOCUMENTS 5,787,571 A * 8/1998 Hatakenaka .......... H01F 27/292
29/605
2007/0294880 A1* 12/2007 Hsieh .................. H01F 41/0246
29/602.1
(Continued)

FOREIGN PATENT DOCUMENTS

CN      104517700 A        4/2015
JP      2000109961 A  *    4/2000   ......... B23K 26/0619
(Continued)

OTHER PUBLICATIONS

Machine Translation of Japanese Patent Publication JP 2004-63769, Feb. 2004. (Year: 2020).*
(Continued)

*Primary Examiner* — A. Dexter Tugbang
(74) *Attorney, Agent, or Firm* — Studebaker & Brackett PC

(57) ABSTRACT

A mother substrate that enables winding cores to be obtained in a manner in which the mother substrate is divided along x-direction division lines and y-direction division lines is prepared. Subsequently, x-direction division grooves are formed along the x-direction division lines on a first main surface of the mother substrate, y-direction division grooves are formed along the y-direction division lines on the first main surface, and shallow bottom surface exposure grooves, for exposing surfaces that are to be core portion bottom surfaces, are formed on the first main surface. The mother substrate is divided by performing a flattening process on a second main surface of the mother substrate that is opposite the first main surface until the second main surface reaches the x-direction division grooves and the y-direction division grooves to obtain the winding cores that are separated from each other.

19 Claims, 19 Drawing Sheets

(51) Int. Cl.
| | |
|---|---|
| *H01F 27/26* | (2006.01) |
| *H02K 15/04* | (2006.01) |
| *H02K 15/02* | (2006.01) |
| *H01F 17/04* | (2006.01) |
| *H01F 17/03* | (2006.01) |
| *H01F 27/29* | (2006.01) |
| *H01L 23/00* | (2006.01) |
| *H01L 21/02* | (2006.01) |

(52) U.S. Cl.
CPC ........... *H01F 27/26* (2013.01); *H01F 27/266* (2013.01); *H01F 27/292* (2013.01); *H01F 41/0206* (2013.01); *H01F 41/0246* (2013.01); *H01F 41/34* (2013.01); *H02K 15/026* (2013.01); *H01L 21/02013* (2013.01); *H01L 24/94* (2013.01); *H01L 24/97* (2013.01); *H01L 2224/98* (2013.01); *H02K 15/0435* (2013.01); *Y10T 29/4902* (2015.01); *Y10T 29/49073* (2015.01); *Y10T 29/49155* (2015.01); *Y10T 29/49609* (2015.01); *Y10T 29/49792* (2015.01); *Y10T 29/49798* (2015.01)

(58) Field of Classification Search
CPC ............. H02K 15/026; H02K 15/0428; H02K 15/0435; Y10T 29/49609; Y10T 29/49073; Y10T 29/4902; Y10T 29/49798; Y10T 29/49792; Y10T 29/49155; H01L 24/97; H01L 2224/98; H01L 21/02013
See application file for complete search history.

(56) References Cited

U.S. PATENT DOCUMENTS

| | | | |
|---|---|---|---|
| 2009/0295525 A1 | 12/2009 | Okawa | |
| 2010/0207227 A1* | 8/2010 | Meyer-Berg | ............ H01L 24/97 257/433 |
| 2013/0322023 A1* | 12/2013 | Kim | .................. Y10T 29/49155 361/720 |
| 2015/0318096 A1* | 11/2015 | Baumann | ............ H01F 41/0246 335/297 |
| 2017/0033029 A1* | 2/2017 | Ritter | ...................... H01L 24/94 |
| 2017/0092411 A1* | 3/2017 | Shimizu | .............. H01F 41/0246 |

FOREIGN PATENT DOCUMENTS

| | | |
|---|---|---|
| JP | 2003-243226 A | 8/2003 |
| JP | 2004-063769 A | 2/2004 |
| JP | 2009-176793 A | 8/2009 |

OTHER PUBLICATIONS

An Office Action mailed by the China National Intellectual Property Administration dated Jul. 27, 2020, which correspond to Chinese Patent Application No. 201811541016.8 and is related to U.S. Appl. No. 16/208,409 with English language translation.

* cited by examiner

METHOD FOR MANUFACTURING A WINDING CORE

CROSS-REFERENCE TO RELATED APPLICATION

This application claims benefit of priority to Japanese Patent Application No. 2017-249004, filed Dec. 26, 2017, the entire content of which is incorporated herein by reference.

BACKGROUND

Technical Field

The disclosure relates to a winding core, a method for manufacturing the winding core, and a winding core aggregate and particularly, to a winding core that is used for a very small winding electronic component whose dimension in the longitudinal direction is less than, for example, 1 mm, a method for manufacturing the winding core, and a winding core aggregate that can be shipped as the winding cores.

Background Art

Techniques that are related to the disclosure are disclosed in, for example, Japanese Unexamined Patent Application Publication No. 2004-63769 and Japanese Unexamined Patent Application Publication No. 2003-243226. Japanese Unexamined Patent Application Publication No. 2004-63769 discloses that winding cores that are separated from each other and that each have substantially H-shaped side surfaces are manufactured in a manner in which upper and lower surfaces of a ferrite block (wafer) having a plate shape are cut to form grooves, and subsequently, the ferrite block is cut in the longitudinal and transverse directions.

Japanese Unexamined Patent Application Publication No. 2003-243226 discloses that winding cores that each have substantially H-shaped side surfaces are manufactured in a manner in which both main surfaces of a sheet that is composed of a magnetic material or a non-magnetic material are cut to form grooves at regular intervals, and subsequently, the sheet is cut in the longitudinal and transverse directions into a substantially rectangular sectional shape. Terminal electrodes are disposed on both end portions of each winding core on the bottom surface side. Recessed portions that are derived from the above grooves and that have a depth more than the thickness of a winding wire are formed on the bottom surface of the winding core between the terminal electrodes and on the upper surface of the winding core.

SUMMARY

The techniques disclosed in Japanese Unexamined Patent Application Publication No. 2004-63769 and Japanese Unexamined Patent Application Publication No. 2003-243226 relate to a method for manufacturing winding cores that are used for relatively small winding electronic components. For example, as disclosed in paragraph 0051 in Japanese Unexamined Patent Application Publication No. 2003-243226, inductors each having a size of about 1.6 mm×0.8 mm×0.8 mm are assumed as the winding electronic components.

However, it can be thought that winding cores break or chip due to a lack of strength when the winding cores are separated from each other with a dicing machine in the case where the technique disclosed in Japanese Unexamined Patent Application Publication No. 2004-63769 or Japanese Unexamined Patent Application Publication No. 2003-243226 is used to obtain a winding electronic component that has a decreased size, such as a very small winding electronic component whose dimension in the longitudinal direction is less than 1 mm, for example, flat dimension is about 0.4 mm×0.2 mm or 0.2 mm×0.1 mm.

Accordingly, the present disclosure provides a method for manufacturing winding cores that have a decreased size and are unlikely to break and chip, which can solve the above problems. The present disclosure also provides the winding cores that are advantageously manufactured by the above manufacturing method and a winding core aggregate that can be shipped as the winding cores.

According to preferred embodiments of the present disclosure, a method for manufacturing winding cores is provided. The winding cores that are manufactured by the method includes a core portion that is located at a central portion in a longitudinal direction and around which a winding wire is to be wound, and a first and second flanges that are respectively connected to first and second end portions that are opposite each other in the longitudinal direction of the core portion.

Each core portion has a core portion bottom surface that is to be directed to a mounting substrate side during mounting, a core portion upper surface that is opposite the core portion bottom surface, and first and second core portion side surfaces that connect the core portion bottom surface and the core portion upper surface to each other and that face away from each other.

Each of the first and second flanges have a flange bottom surface that is to be directed to the mounting substrate side and that is to be nearer than the core portion bottom surface to the mounting substrate during mounting, a flange upper surface that is opposite the flange bottom surface, first and second flange side surfaces that are to be perpendicular to the mounting substrate during mounting, that connect the flange bottom surface and the flange upper surface to each other, and that face away from each other, an inner end surface that faces the core portion and on which an end portion of the core portion is disposed, and an outer end surface that is opposite the inner end surface and that faces outward.

According to preferred embodiments of the present disclosure, the method for manufacturing the winding cores each having the above structure includes preparing a mother substrate that is composed of a nonconductive material and that enables the winding cores to be obtained in a manner in which the mother substrate is divided along x-direction division lines and y-direction division lines that are perpendicular to each other, forming x-direction division grooves along the x-direction division lines on a first main surface of the mother substrate, and forming y-direction division grooves along the y-direction division lines on the first main surface of the mother substrate. The method further includes forming bottom surface exposure grooves, for exposing surfaces each of which is to be the core portion bottom surface, on the first main surface of the mother substrate such that the bottom surface exposure grooves are shallower than the x-direction division grooves and the y-direction division grooves, and dividing the mother substrate by performing a flattening process on a second main surface of the mother substrate that is opposite the first main surface until the second main surface reaches the x-direction division grooves and the y-direction division grooves to obtain the winding cores that are separated from each other.

According to preferred embodiments of the present disclosure, in the manufacturing method, a required form of each winding core is prepared on the mother substrate before the mother substrate is finally divided, and the mother substrate is divided by performing the flattening process on the second main surface of the mother substrate until the second main surface reaches the x-direction division grooves and the y-direction division grooves. This enables a possibility of a break or a chip to be decreased.

The flange bottom surface of each winding core obtained can be nearer than the core portion bottom surface to the mounting substrate. In other words, the position of the core portion bottom surface is lower than that of the flange bottom surface.

The above structure of each winding core not only enables the effect of the winding wire on the height of an electronic component to be decreased particularly near the core portion bottom surface but also enables a possibility that solder adheres to the winding wire during mounting to be decreased.

The mother substrate is preferably divided with the mother substrate reinforced from the first main surface. This facilitates handling of the mother substrate during the division and enables the height of each winding core to be decreased.

According to preferred embodiments of the present disclosure, the x-direction division grooves, the y-direction division grooves, and the bottom surface exposure grooves are preferably formed with a dicing machine. The use of the dicing machine enables the flattening process to be performed while an end of a blade is dressed. Accordingly, the x-direction division grooves, the y-direction division grooves, and the bottom surface exposure grooves can be reproducibly formed at accurate positions with accurate dimensions. The use of the dicing machine also enables a design to be readily changed by merely changing a program therein. In the case where the same dicing machine, that is, the same processing equipment is used to form the three kinds of the grooves: the x-direction division grooves, the y-direction division grooves, and the bottom surface exposure grooves that define the shape of each winding core to be obtained, variation in shape does not occur due to different processing accuracy between different processes, which can be made when the processes are performed. In addition, the three kinds of the grooves can be efficiently formed without a changeover.

According to preferred embodiments of the present disclosure, in the manufacturing method, forming the bottom surface exposure grooves may include forming the bottom surface exposure grooves such that the core portion bottom surface inclines with respect to a center axis of the core portion. In each winding core manufactured by this method, the core portion bottom surface inclines. Accordingly, a coil component that includes the winding core can have a decreased distributed capacitance between lines of the winding wire that is spirally wound around the core portion.

According to preferred embodiments of the present disclosure, in the manufacturing method, forming the bottom surface exposure grooves may include forming the bottom surface exposure grooves such that the core portion bottom surface has irregularities that are arranged in a direction of a center axis of the core portion. In each winding core manufactured by this method, a pitch between the lines of the winding wire that is wound around the core portion can be determined on the basis of the irregularities. Accordingly, variation in characteristics such as an inductance of a coil component that includes the winding core can be reduced. In the case where the irregularities are formed in a saw tooth shape, and some lines of the winding wire that is wound at multiple times are arranged on an incline portion of a corresponding one of the saw tooth, the distributed capacitance between the lines of the winding wire can be decreased as with the above embodiment.

The method may include forming upper surface exposure grooves, for exposing surfaces each of which is to be the core portion upper surface, on the second main surface of the mother substrate at positions at which the upper surface exposure grooves are lined up with the bottom surface exposure grooves such that a position of the core portion upper surface is lower than that of the flange upper surface before the mother substrate is divided. In each winding core obtained by this manufacturing method, the flange bottom surface can be nearer than the core portion bottom surface to the mounting substrate, and the position of the core portion upper surface is lower than that of the flange upper surface, in other words, the core portion upper surface can be nearer than the flange upper surface to the center axis of the core portion.

Each winding core having the above structure enables the effect of the winding wire on the height of an electronic component to be decreased, and an example of the effect is that the winding wire greatly projects from the flange upper surface and that the size of a winding-wire-attached electronic component increases. Since the winding wire does not project from the winding core, a mounter can more successfully pick up the electronic component when the electronic component is mounted.

Similarly, the upper surface exposure grooves are preferably formed with a dicing machine. The use of the dicing machine enables the upper surface exposure grooves to be reproducibly formed at accurate positions with accurate dimensions.

Forming the upper surface exposure grooves may include forming the upper surface exposure grooves such that the core portion upper surface inclines with respect to a center axis of the core portion. In each winding core manufactured by this method, the core portion upper surface inclines. Accordingly, a coil component that includes the winding core can have a decreased distributed capacitance between the lines of the winding wire that is spirally wound around the core portion.

Forming the upper surface exposure grooves may include forming the upper surface exposure grooves such that the core portion upper surface has irregularities that are arranged in a direction of a center axis of the core portion. In each winding core manufactured by this method, the pitch between the lines of the winding wire that is wound around the core portion can be determined on the basis of the irregularities. Accordingly, variation in characteristics such as an inductance of a coil component that includes the winding core can be reduced. In the case where the irregularities are formed in a saw tooth shape, and some lines of the winding wire that is wound at multiple times are arranged on an incline portion of a corresponding one of the saw tooth, the distributed capacitance between the lines of the winding wire can be decreased as with the above embodiments.

The method may include forming through-holes, for locating the first and second core portion side surfaces at positions lower than the first and second flange side surfaces, in the mother substrate before the mother substrate is divided. In each winding core manufactured by this method, the positions of the first and second core portion side surfaces are lower than those of the first and second flange side surfaces, in other words, the first and second core portion side surfaces are nearer than the first and second flange side surfaces to the center axis of the core portion. This is achieved by merely forming the through-holes in the mother substrate.

Each winding core having the above structure enables the effect of the winding wire on the width of an electronic component to be decreased, and an example of the effect is that the winding wire greatly projects from the flange side surfaces, and the size of a winding-wire-attached electronic component increases.

Each winding core manufactured by the method preferably further includes at least one first terminal electrode that is disposed on the flange bottom surface of the first flange and at least one second terminal electrode that is disposed on the flange bottom surface of the second flange. To form the at least one first terminal electrode and the at least one second terminal electrode, conductor films that are to be the at least one first terminal electrode and the at least one second terminal may be formed on the first main surface of the mother substrate before the mother substrate is divided. This enables the winding core that includes the at least one first terminal electrode and the at least one second terminal electrode to be obtained when the mother substrate is divided. Accordingly, productivity can be greatly improved, unlike the case of forming terminal electrodes on winding cores after separation.

According to the above embodiment, forming the conductor films may include forming the conductor films on the first main surface of the mother substrate such that each conductor film has a shape following a shape of a corresponding one of the flange bottom surfaces of the at least one first terminal electrode and the at least one second terminal. Alternatively, forming the conductor films may include forming the conductor films on the first main surface of the mother substrate and subsequently removing parts of the conductor films such that each conductor film has a shape following a shape of a corresponding one of the flange bottom surfaces of the at least one first terminal electrode and the at least one second terminal.

In the latter case, removing the parts of the conductor films may include forming a split groove on the first main surface of the mother substrate with a dicing machine such that the conductor films are separated from each other. This enables the use of the same processing equipment as the processing equipment that is used to form the x-direction division grooves, the y-direction division grooves, and the bottom surface exposure grooves. Accordingly, these grooves can be efficiently formed without a changeover. Consequently, variation in core shape does not occur due to different processing accuracy between different processes, and the accuracy of the dimensions of each winding core can be improved.

In the case where the conductor films that are to be the at least one first terminal electrode and the at least one second terminal are formed, the method preferably includes forming plating layers on the conductor films by electroplating with the conductor films used as underlying layers before the mother substrate is divided. Performing electroplating before the mother substrate is divided enables electroplating to be performed more efficiently than in the case where electroplating is performed on winding cores that are separated from each other after the mother substrate is divided.

According to preferred embodiments of the present disclosure, forming the x-direction division grooves preferably includes forming at least two x-direction division grooves that are parallel to each other along each x-direction division line that partitions regions that are to be the adjoining winding cores on the mother substrate, and forming the y-direction division grooves preferably includes forming at least two y-direction division grooves that are parallel to each other along each y-direction division line that partitions regions that are to be the adjoining winding cores on the mother substrate.

This manufacturing method enables a pressure that is applied to the mother substrate to spread when the flattening process is performed to divide the mother substrate. Consequently, a load that is applied to the region of each winding core as a product decreases, and the winding core as a product is unlikely to break and so on.

According to preferred embodiments of the present disclosure, the nonconductive material of which the mother substrate is composed is preferably ceramics. In this case, the ceramics is fired at a certain stage. The mother substrate that is composed of ceramics enables winding cores each of which is composed of a magnetic material such as ferrite to be obtained.

According to preferred embodiments of the present disclosure, a winding core that has the following structure is provided. The winding core can be advantageously manufactured by the above manufacturing method.

According to preferred embodiments of the present disclosure, a winding core includes a core portion that is located at a central portion in a longitudinal direction and around which a winding wire is to be wound, a first and second flanges that are respectively connected to first and second end portions that are opposite each other in the longitudinal direction of the core portion. At least one first terminal electrode that is disposed on the first flange, and at least one second terminal electrode that is disposed on the second flange. The core portion has a core portion bottom surface that is to be directed to a mounting substrate side during mounting, a core portion upper surface that is opposite the core portion bottom surface, and first and second core portion side surfaces that connect the core portion bottom surface and the core portion upper surface to each other and that face away from each other.

Each of the first and second flanges has a flange bottom surface that is to be directed to the mounting substrate side and that is to be nearer than the core portion bottom surface to the mounting substrate during mounting, a flange upper surface that is opposite the flange bottom surface, first and second flange side surfaces that are to be perpendicular to the mounting substrate during mounting, that connect the flange bottom surface and the flange upper surface to each other, and that face away from each other, an inner end surface that faces the core portion and on which an end portion of the core portion is disposed, and an outer end surface that is opposite the inner end surface and that faces outward. Each of the at least one first terminal electrode and the at least one second terminal electrode includes at least one underlying layer, and the at least one underlying layer is formed on the corresponding flange bottom surface and does not extend to the first and second flange side surfaces, the inner end surface, and the outer end surface.

The above structure enables the winding core to be unlikely to break and chip.

Each of the at least one first terminal electrode and the at least one second terminal electrode further may include at least one plating layer that is formed on the at least one underlying layer. Only the at least one underlying layer of the at least one first terminal electrode and the at least one second terminal electrode does not extend to the first and second flange side surfaces, the inner end surface, and the outer end surface. The plating layer may extend to at least one surface of the first and second flange side surfaces, the inner end surface, and the outer end surface.

According to preferred embodiments of the present disclosure, a winding core aggregate includes the above winding cores and a carrier sheet that adhesively holds the winding cores near the at least one first terminal electrode and the at least one second terminal electrode with the winding cores arranged in an x-direction and a y-direction that are perpendicular to each other. The winding core aggregate corresponds to an intermediate product that is obtained right after the flattening process is performed to divide the mother substrate in the above method for manufacturing the winding cores. The winding core aggregate can be shipped as the winding cores as products, or can be transported during manufacturing processes. According to preferred embodiments of the present disclosure, the winding core aggregate enables the winding cores that are unlikely to break and chip to be efficiently shipped or transported.

According to preferred embodiments of the present disclosure, in the manufacturing method, a required form of each winding core is prepared on the mother substrate before the mother substrate is finally divided, and the mother substrate is divided by performing the flattening process on the second main surface of the mother substrate until the second main surface reaches the x-direction division grooves and the y-direction division grooves. This enables a possibility of a break or a chip to be decreased. Accordingly, a very small winding core whose dimension in the longitudinal direction is less than, for example, 1 mm can be manufactured in high yield.

Other features, elements, characteristics and advantages of the present disclosure will become more apparent from the following detailed description of preferred embodiments of the present disclosure with reference to the attached drawings.

DETAILED DESCRIPTION

First Embodiment

Figure 1:
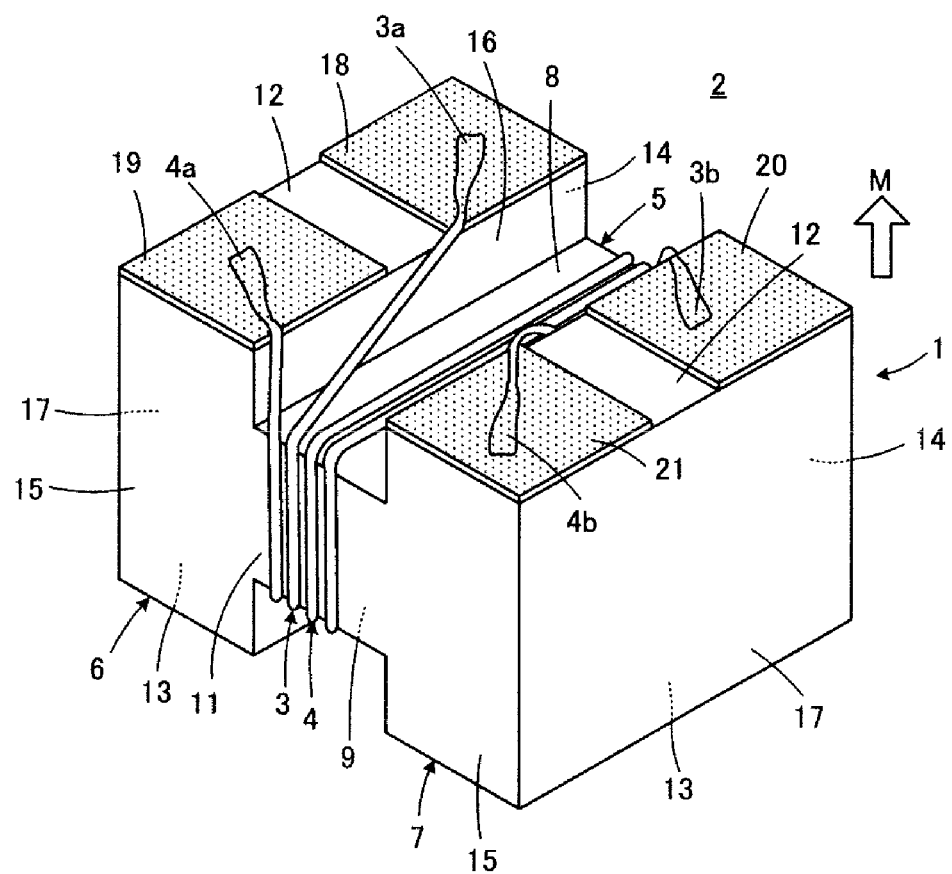
FIG. 1 is a perspective view of a winding-wire-attached electronic component that includes a winding core according to a first embodiment of the disclosure with a surface that is to be directed to a mounting substrate side M facing upward.
Figure 2:
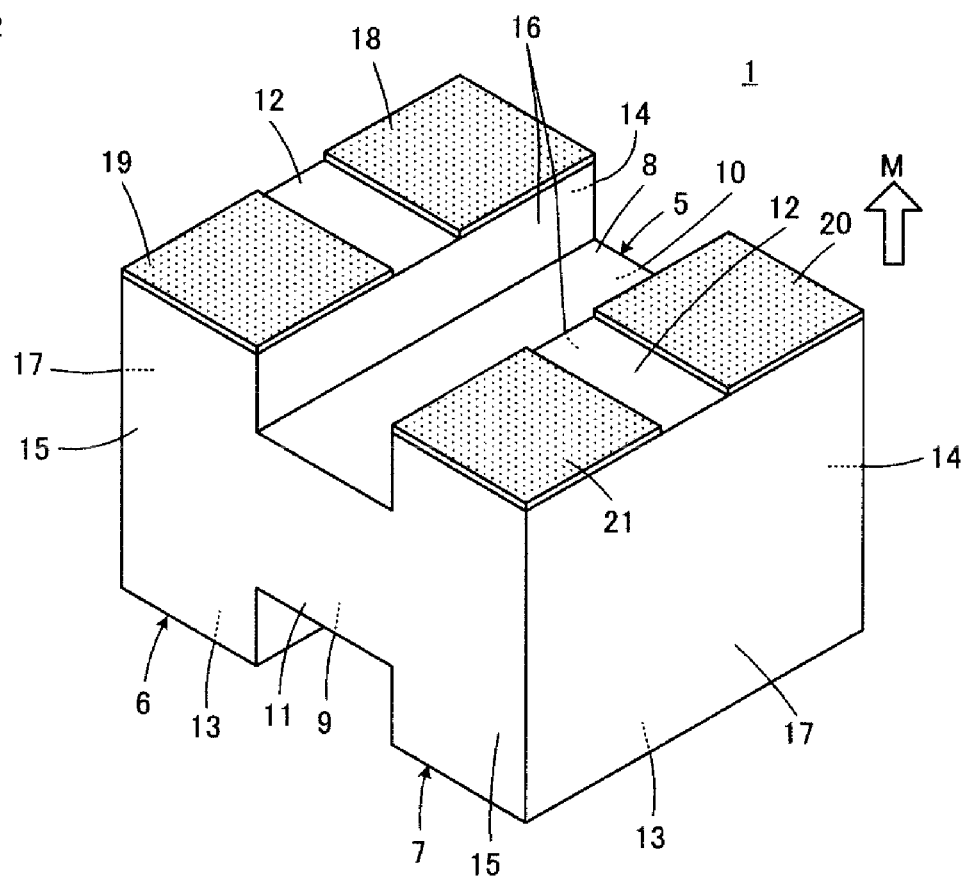
FIG. 2 is a perspective view of the winding core illustrated in FIG. 1.

Referring to FIG. 1 and FIG. 2, a winding-wire-attached electronic component 2 that includes a winding core 1 according to a first embodiment of the disclosure will be described. In FIG. 1 and FIG. 2, the winding-wire-attached electronic component 2 or the winding core 1 is illustrated with a surface that is to be directed to a mounting substrate side M facing upward. The winding-wire-attached electronic component 2 illustrated forms, for example, a common-mode choke coil.

The winding core 1 that is included in the winding-wire-attached electronic component 2 includes a core portion 5 around which winding wires 3 and 4 are wound. Parts of the winding wires 3 and 4 are omitted in FIG. 1. The core portion 5 is located at a central portion in the longitudinal direction of the winding core 1. The winding core 1 includes first and second flanges 6 and 7 that are respectively connected to first and second end portions of the core portion 5 that are opposite each other in the longitudinal direction. The core portion 5 and the first and second flanges 6 and 7 are integrally formed.

The winding core 1 is composed of a nonconductive material, more specifically, a non-magnetic material such as alumina, glass, or a resin or a magnetic material such as ferrite or a resin containing magnetic powder. The winding core 1 is preferably composed of ceramics containing alumina, glass, or ferrite when being manufactured by a method described later.

The core portion 5 and the flanges 6 and 7 each have a rectangular or substantially rectangular sectional shape along a plane perpendicular to the longitudinal direction of the core portion 5. Consequently, the core portion 5 has a core portion bottom surface 8 that is to be directed to a mounting substrate side M during mounting, a core portion upper surface 9 that is opposite the core portion bottom surface 8, and first and second core portion side surfaces 10 and 11 that connect the core portion bottom surface 8 and the core portion upper surface 9 to each other and that face away from each other.

Each of the first and second flanges 6 and 7 has a flange bottom surface 12 that is to be directed to the mounting substrate side M and that is to be nearer than the core portion bottom surface 8 to a mounting substrate during mounting, a flange upper surface 13 that is opposite the flange bottom surface 12, first and second flange side surfaces 14 and 15 that are to be perpendicular to the mounting substrate during mounting, that connect the flange bottom surface 12 and the flange upper surface 13 to each other, and that face away from each other, an inner end surface 16 that faces the core portion 5, and an outer end surface 17 that is opposite the inner end surface 16 and that faces outward. Each of the end portions of the core portion 5 are disposed on the corresponding inner end surface 16. The ridges and corners of the winding core 1 are preferably chamfered by, for example, blasting although this is not illustrated.

First and second terminal electrodes 18 and 19 are disposed on the first flange 6. Third and fourth terminal electrodes 20 and 21 are disposed on the second flange 7. Each of the terminal electrodes 18 to 21 is preferably formed of an underlying layer and a plating layer that is formed on the underlying layer although this is not illustrated in FIG. 1 and FIG. 2. The underlying layer of each of the terminal electrodes 18 to 21 contains a metal such as silver, gold, copper, or nickel as a conductive component. The plating layer is formed of, for example, a nickel plating film and a tin plating film. The plating layer may include a copper plating film.

Each of the winding wires 3 and 4 is formed of, for example, a copper wire that is coated with a resin such as polyurethane or polyimide and insulated. The winding wires 3 and 4 are spirally wound around the core portion 5 in the same direction. A first end 3a of the first winding wire 3 is connected to the first terminal electrode 18. A second end 3b of the first winding wire 3 that is opposite the first end 3a is connected to the third terminal electrode 20. A first end 4a of the second winding wire 4 is connected to the second terminal electrode 19. A second end 4b of the second winding wire 4 that is opposite the first end 4a is connected to the fourth terminal electrode 21. The terminal electrodes 18 to 21 and the winding wires 3 and 4 are connected to each other by, for example, thermo-compression bonding.

Since each flange bottom surface 12 is to be nearer than the core portion bottom surface 8 to the mounting substrate as described above, in other words, the position of the flange bottom surface 12 is to be higher than that of the core portion bottom surface 8, the winding wires 3 and 4 can be prevented from protruding on the mounting substrate side M from the flanges 6 and 7 to the outside. Accordingly, the winding wires 3 and 4 can be protected from a stress that is applied from the mounting substrate side M, and the effect of the winding wires 3 and 4 on the height of the electronic component 2 can be decreased. The winding wires 3 and 4 can be sufficiently spaced apart from solder applied to the terminal electrodes 18 to 21 during mounting, and the winding wires 3 and 4 can be prevented from being adversely affected by solder attached to the winding wires 3 and 4.

The position of each flange upper surface 13 is higher than that of the core portion upper surface 9. Accordingly, the winding wires 3 and 4 can be prevented near the core portion upper surface 9 from protruding from the flanges 6 and 7 to the outside. Accordingly, the winding wires 3 and 4 can be protected from a stress that is applied from a mounter for mounting the electronic component 2 on the mounting substrate. In addition, the mounter less interferes with the winding wires 3 and 4, and the mounting ability of the mounter can be improved. Furthermore, the effect of the winding wires 3 and 4 on the height of the electronic component 2 can be decreased.

A method for manufacturing the winding cores 1 illustrated in FIG. 2 will now be described with reference to FIG. 3 to FIG. 9.

Figure 3:
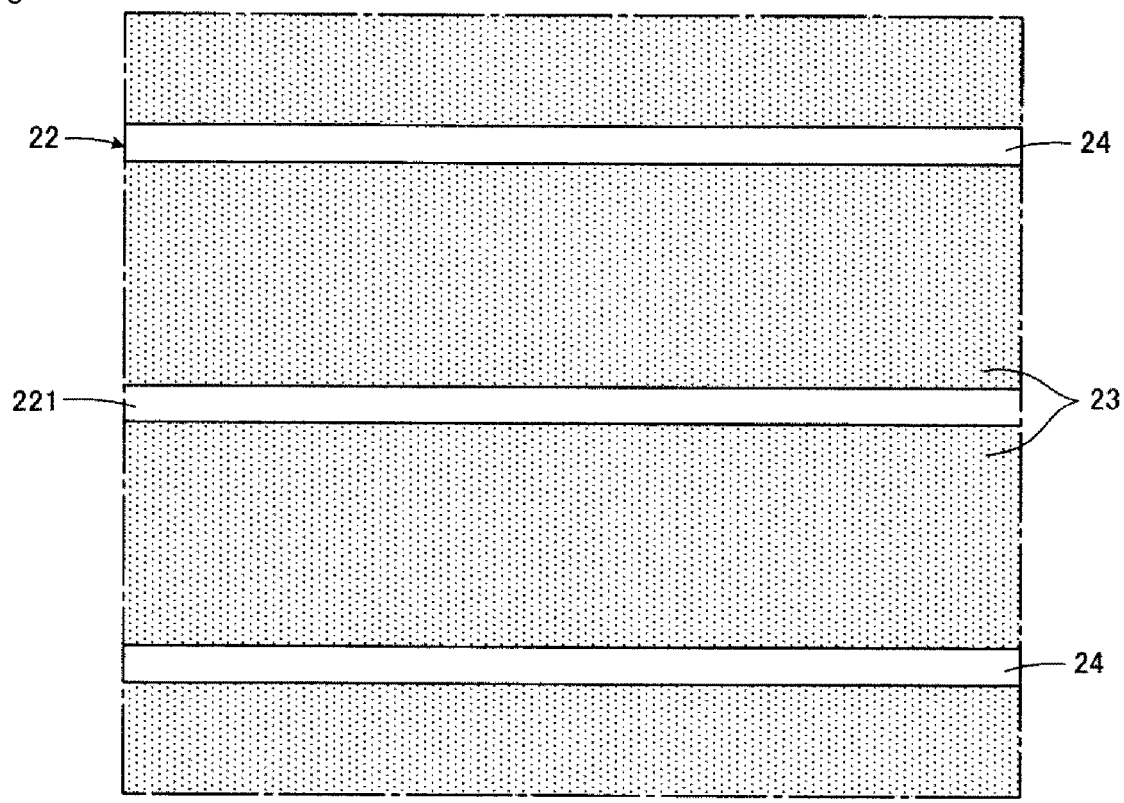
FIG. 3 is a plan view of a mother substrate that is prepared to manufacture the winding core illustrated in FIG. 2.

As illustrated in FIG. 3, a mother substrate 22 that is composed of ceramics containing a nonconductive material such as alumina, glass, or ferrite is prepared. The winding cores 1 can be obtained from the mother substrate 22 in a manner in which the mother substrate 22 is divided along x-direction division lines 25 and y-direction division lines 26 (see FIG. 4) that are perpendicular to each other. To ensure a strength sufficient to endure the following processes, the thickness of the mother substrate 22 is preferably increased, for example, to a thickness about 1.2 times the thickness of each winding core 1 to be obtained, that is, a distance between the flange bottom surface 12 and the flange upper surface 13. However, the strength may be ensured by using another reinforcement member. In this case, the thickness of the mother substrate 22 is not limited.

The mother substrate 22 may be a sintered substrate or may be an unfired substrate. In the case where the mother substrate 22 is an unfired substrate, the ceramics is fired before or after any one of processes described below. That is, the ceramics may be fired before division grooves described later are formed or before the mother substrate is divided after the division grooves are formed.

Subsequently, as illustrated in FIG. 3, conductor films 23 that are to be the terminal electrodes 18 to 21 are formed on a first main surface 221 of the mother substrate 22. Each conductor film 23 contains a metal such as silver, gold, copper, or nickel as a conductive component. The conductor films 23 are formed by, for example, sputtering, applying a conductive paste, or electroless plating and are preferably formed by sputtering. Sputtering enables the conductor films 23 to be accurately formed with few defects and enables adhesion to the mother substrate 22 to be increased. In addition, sputtering enables the conductor films 23 to be formed with a thickness less than that in the case of a printing method, and a dicing machine described later is unlikely to be clogged when the grooves are formed with the dicing machine.

Each conductor film 23 has a substantially stripe shape. The shape of the conductor film 23 is selected to fit into the shape of the flange bottom surface 12 of a corresponding one of the terminal electrodes 18 to 21. As clear from a description below, substantially stripe-shaped regions 24 in which no conductor films 23 are formed are formed to separate the first and second terminal electrodes 18 and 19 from each other and separate the third and fourth terminal electrodes 20 and 21 from each other as illustrated in FIG. 1 and FIG. 2.

To form each of the substantially stripe-shaped conductor films 23, the conductor film 23 that has a substantially stripe shape from the beginning may be formed on the first main surface 221 of the mother substrate 22, or a part of the conductor film 23 may be removed such that the conductor film 23 has a substantially stripe shape after the conductor film 23 is formed on the first main surface 221 of the mother substrate 22.

In the former case where each conductor film 23 that has a substantially stripe shape from the beginning is formed, for example, a sputtering method or a printing method with a conductive paste may be used together with a mask. In the latter case where a part of each conductor film 23 is removed such that the conductor film 23 has a substantially stripe shape, for example, an etching method is used. When the part of the conductor film 23 is removed, a method of forming grooves that separate the conductor films 23 from each other can be performed as with an embodiment illustrated in FIG. 20 to FIG. 22.

Figure 4:
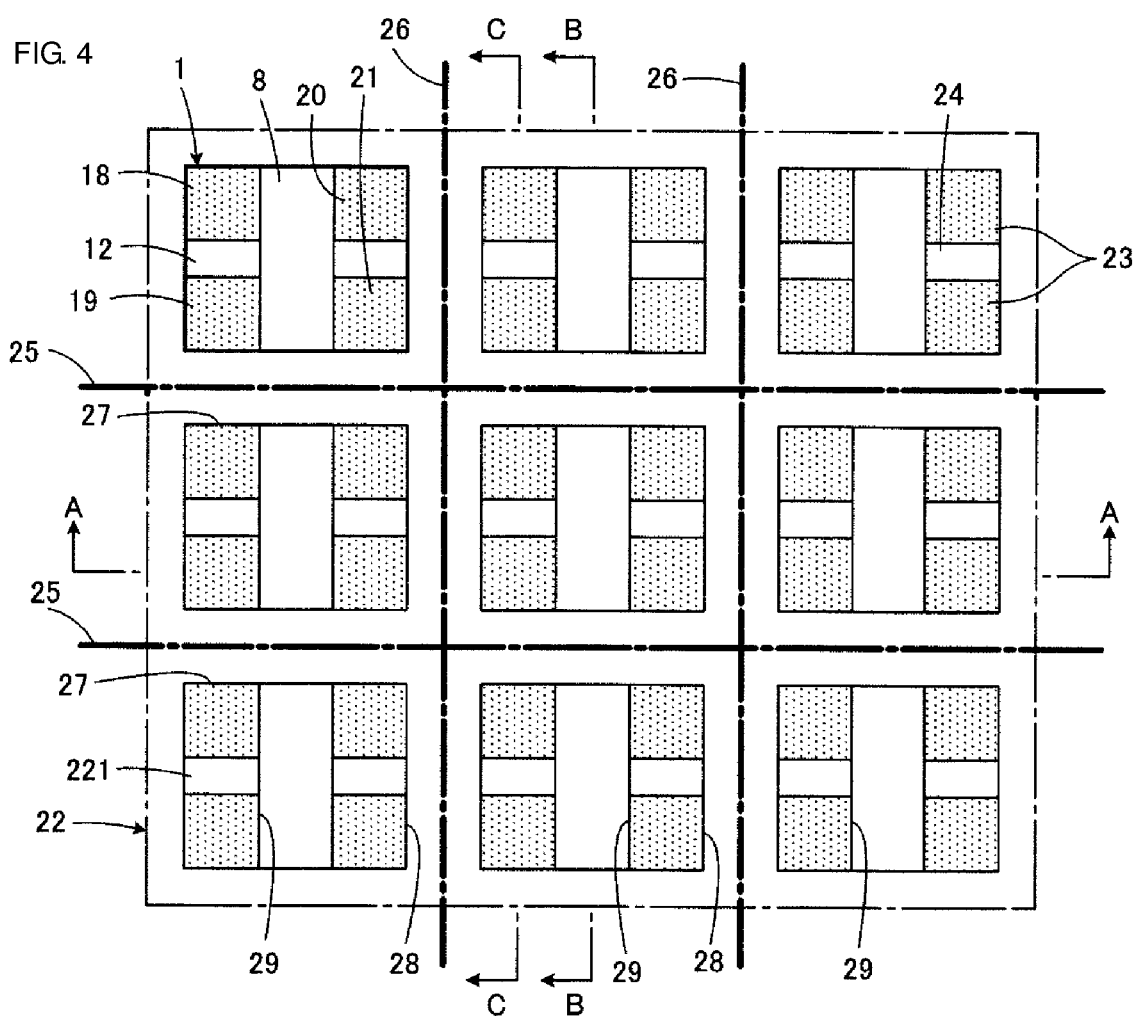
FIG. 4 is a plan view of a first main surface of the mother substrate illustrated in FIG. 3 on which x-direction division grooves, y-direction division grooves, and bottom surface exposure grooves are formed.

Subsequently, as illustrated in FIG. 4, x-direction division grooves 27 are formed along the x-direction division lines 25 on the first main surface 221 of the mother substrate 22, and y-direction division grooves 28 are formed along the y-direction division lines 26 thereon. To expose surfaces each of which is to be the core portion bottom surface 8, bottom surface exposure grooves 29 that extend in the y-direction are formed on the first main surface 221 of the mother substrate 22 such that the bottom surface exposure grooves 29 are shallower than the x-direction division grooves 27 and the y-direction division grooves 28.

Figure 5:
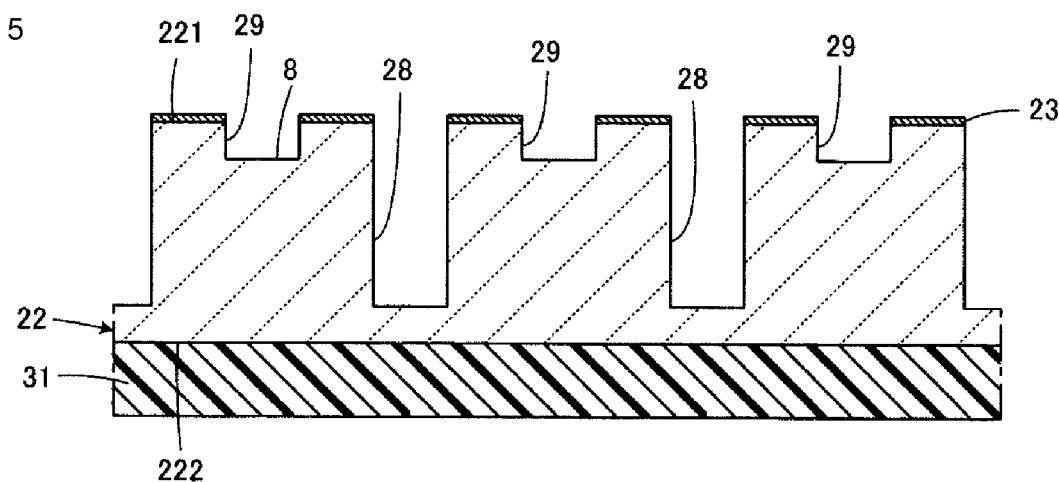
FIG. 5 is a sectional view of FIG. 4 taken along line A-A.
Figure 6:
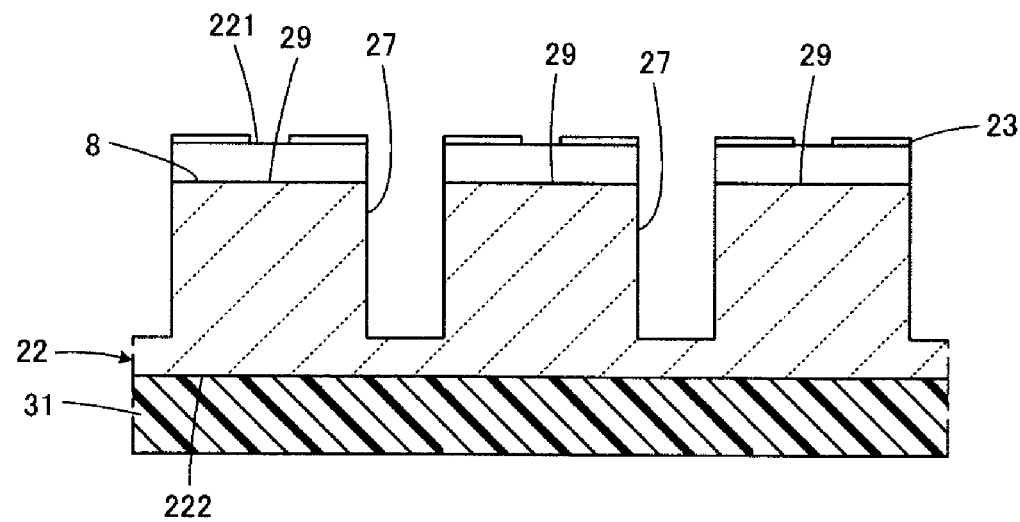
FIG. 6 is a sectional view of FIG. 4 taken along line B-B.

The x-direction division grooves 27 are also illustrated in FIG. 6. The y-direction division grooves 28 are also illustrated in FIG. 5. The bottom surface exposure grooves 29 are also illustrated in FIG. 5 and FIG. 6.

In FIG. 4, a portion that is to be one of the winding cores 1 is surrounded by thick lines. That is, the thick lines at the upper left in FIG. 4 define the portion that is to be the winding core 1. In this state, each flange bottom surface 12 of the winding core 1 can be nearer than the core portion bottom surface 8 to the mounting substrate. In other words, the position of the core portion bottom surfaces 8 is lower than that of each flange bottom surface 12. Each of the terminal electrodes 18 to 21 is formed on the corresponding flange bottom surface 12.

The x-direction division grooves 27, the y-direction division grooves 28, and the bottom surface exposure grooves 29 are preferably formed with a dicing machine. The use of the dicing machine enables a grinding process to be performed while an end of a blade is dressed. Accordingly, the x-direction division grooves 27, the y-direction division grooves 28, and the bottom surface exposure grooves 29 can be reproducibly formed at accurate positions with accurate dimensions. The use of the dicing machine also enables a design to be readily changed by merely changing a program therein. In the case where the same dicing machine, that is, the same processing equipment is used to form the three kinds of the grooves: the x-direction division grooves 27, the y-direction division grooves 28, and the bottom surface exposure grooves 29, variation in shape does not occur due to different processing accuracy between different processes, which can be made when the processes are performed. In addition, the three kinds of the grooves can be efficiently formed without a changeover.

Figure 7:
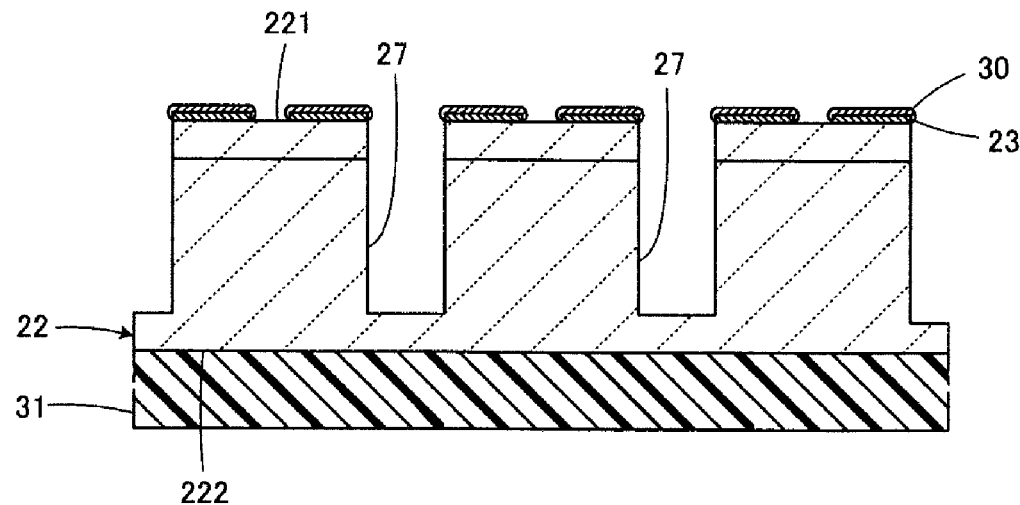
FIG. 7 illustrates a section corresponding to a section along line C-C in FIG. 4 and illustrates a sectional view of conductor films illustrated in FIG. 6 on which respective plating layers are formed.

Subsequently, as illustrated in FIG. 7, the conductor films 23 that are to be the terminal electrodes 18 to 21 are used as the underlying layers to form plating layers 30 thereon by electroplating. Each plating layer 30 is formed of, for example, a nickel plating film and a tin plating film.

The processes illustrated in FIG. 3 to FIG. 7 are preferably performed with the mother substrate 22 reinforced in a manner in which a carrier sheet 31 adhesively holds the mother substrate 22 along a second main surface 222 as illustrated in FIG. 5 to FIG. 7. This enables the mother substrate 22 to ensure a strength sufficient to endure various processes during the above processes. The carrier sheet 31 is typically formed of a flexible resin film. However, the material of the carrier sheet 31 may be a material that is harder than the resin film to increase the strength of the mother substrate 22.

The reinforcement may be, for example, a resin or metal film coating instead of the carrier sheet 31 that adheres thereto. It is not necessary for the entire second main surface 222 to be reinforced, and a portion thereof may be reinforced by the carrier sheet 31 that adheres to the part or the coating.

The depth of the division grooves 27 and 28 depends on the size of each winding core 1 to be manufactured. When the mother substrate 22 itself is sufficiently thick as compared with the depth of the division grooves 27 and 28, the reinforcement can be not necessary.

Figure 8:
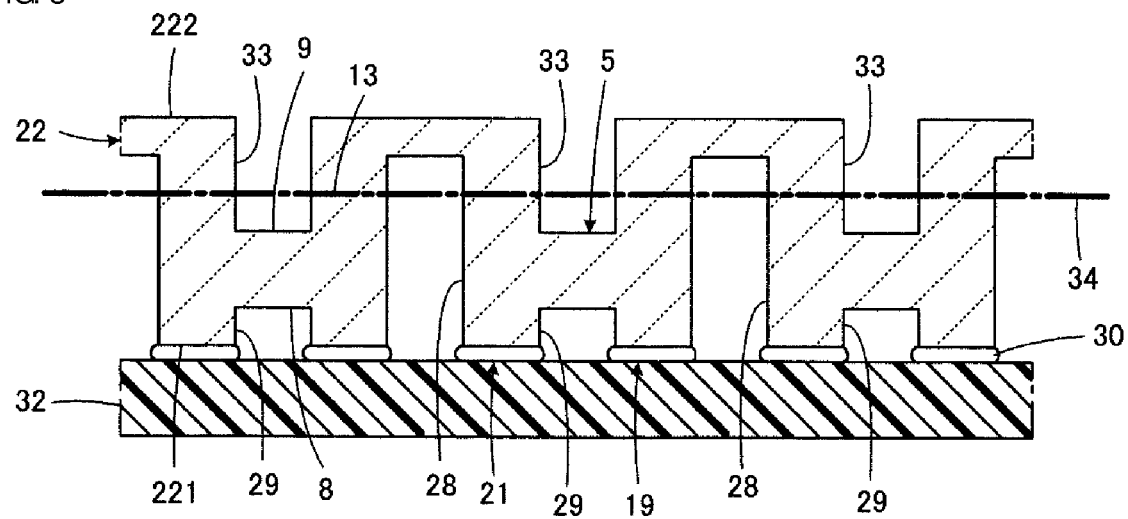
FIG. 8 illustrates the same section as in FIG. 5 and illustrates a sectional view of a second main surface of the mother substrate on which upper surface exposure grooves that are lined up with bottom surface exposure grooves are formed with the mother substrate illustrated in FIG. 7 upside down.

Subsequently, as illustrated in FIG. 8, the carrier sheet 31 is removed from the second main surface 222 of the mother substrate 22, and a carrier sheet 32 is disposed on the first main surface 221 of the mother substrate 22. The mother substrate 22 is reversed such that the second main surface 222 faces upward. The carrier sheet 32 adhesively holds the mother substrate 22 to reinforce the mother substrate 22 as with the carrier sheet 31. The carrier sheet 32 is typically formed of a flexible resin film. However, the material of the carrier sheet 32 may be a material that is harder than the resin film to increase the strength of the mother substrate 22.

Subsequently, as illustrated in FIG. 8, to expose surfaces each of which is to be the core portion upper surface 9, upper surface exposure grooves 33 are formed on the second main surface 222 of the mother substrate 22 at positions at which the upper surface exposure grooves 33 are lined up with the bottom surface exposure grooves 29.

The upper surface exposure grooves 33 are preferably formed with a dicing machine. The use of the dicing machine offers the same advantage as in the case where the x-direction division grooves 27, the y-direction division grooves 28, and the bottom surface exposure grooves 29 are formed with a dicing machine, and the upper surface exposure grooves 33 can be reproducibly formed at accurate positions with accurate dimensions.

Figure 9:
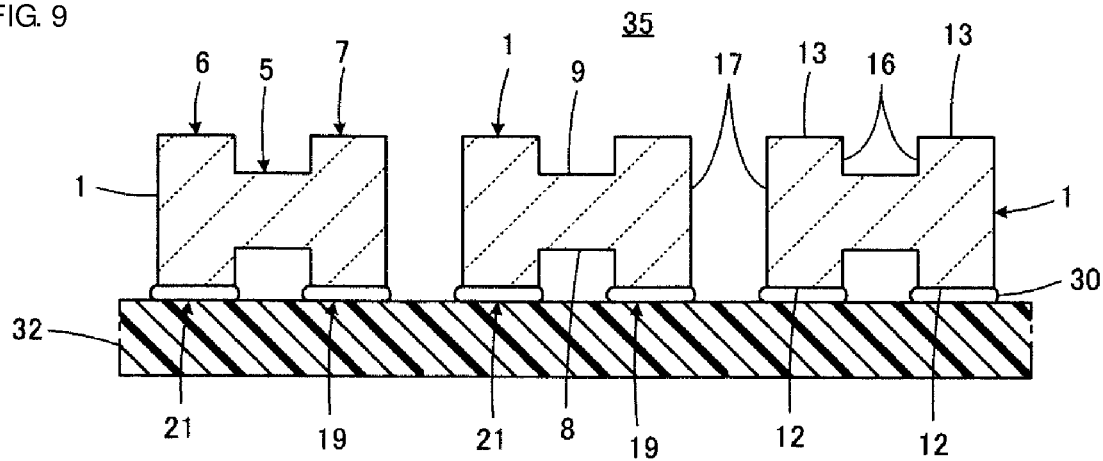
FIG. 9 illustrates the same section as in FIG. 5 after a flattening process is performed on the second main surface of the mother substrate illustrated in FIG. 8 to divide the mother substrate.

Subsequently, as illustrated in FIG. 8, a flattening process is performed on the second main surface 222 of the mother substrate 22 with the mother substrate 22 reinforced by the carrier sheet 32 that adheres to the first main surface 221 of the mother substrate 22 until the second main surface 222 reaches the x-direction division grooves 27 and the y-direction division grooves 28, for example, up to a position represented by a one-dot chain line 34 illustrated in FIG. 8. FIG. 9 illustrates a state after the flattening process. The flattening process means a process including polishing, grinding, and cutting.

Through the above processes, the position of the core portion upper surface 9 can be lower than that of the flange upper surface 13, in other words, the core portion upper surface 9 can be nearer than the flange upper surface 13 to the center axis of the core portion 5.

As a result of the flattening process, as illustrated in FIG. 9, the mother substrate 22 is divided, and consequently, the winding cores 1 that are separated from each other are obtained. The flattening process for the separation eliminates the need to equalize the thickness of the mother substrate 22 before the separation with the height of each winding core 1 to be obtained. Also, in the case where the reinforcement such as the carrier sheet 32 adheres to the mother substrate 22, there is no need to equalize the thickness of the mother substrate 22 with the height of the winding core 1. Accordingly, the manufacturing processes can be performed with the strength of the mother substrate 22 maintained even when the winding cores 1 to be manufactured are very thin and very small.

Right after the above processes are finished, the winding cores 1 are held by the carrier sheet 32 near the terminal electrodes 18 to 21. As easily presumed from FIG. 4, the winding cores 1 are arranged in the x-direction and the y-direction that are perpendicular to each other.

The winding cores 1 that are separated from each other are detached from the carrier sheet 32 and can be individually handled as illustrated in FIG. 2. The winding cores 1 that are manufactured by the above manufacturing method are characterized in that at least each underlying layer of the terminal electrodes 18 to 21 is formed of the conductor film 23 on the corresponding flange bottom surface 12 and do not extend to the first and second flange side surfaces 14 and 15, the inner end surface 16, and the outer end surface 17. Each plating layer 30 of the terminal electrodes 18 to 21 may extend to at least one surface of the first and second flange side surfaces 14 and 15, the inner end surface 16, and the outer end surface 17.

As illustrated in FIG. 9, a winding core aggregate 35 includes the carrier sheet 32 and the winding cores 1 that are adhesively held by the carrier sheet 32 near the terminal electrodes 18 to 21 and can be shipped as the winding cores 1 or can be transported during the manufacturing processes.

According to the first embodiment described above, the winding cores 1 are unlikely to break and chip when being manufactured even when the winding cores 1 are small as described above. In addition, the following effects are achieved.

The division of the mother substrate 22 enables a large number of the winding cores 1 to be obtained at the same time and achieves high productivity. The smaller the winding cores 1 to be obtained, the larger the number of the winding cores 1 obtained from the mother substrate 22. Accordingly, the cost of each winding core 1 can be decreased.

The size of each winding core 1 can be changed by merely changing the distance between the x-direction division grooves 27 and between the y-direction division grooves 28 on the mother substrate 22. This means that various design changes can be rapidly accommodated. In addition, in the mother substrate 22, the x-direction division grooves 27 may be spaced at different intervals, and the y-direction division grooves 28 may be spaced at different intervals. Thus, different kinds of the winding cores 1 having different sizes can be obtained from the mother substrate 22, and this enables response to request of high-mix low-volume production.

Processes that are performed as necessary include formation of the conductor films 23 for the terminal electrodes 18 to 21 that are formed on each winding core 1, formation of the plating layers 30 on the conductor films 23 that serve as the underlying layers, an edge process and a deburring process on the winding core 1, and formation of a hard film on a surface of the winding core 1. These processes can be performed on the mother substrate 22 as it is. Accordingly, the processes can be efficiently performed.

The above effects can be achieved also in embodiments described below.

Second Embodiment

Referring to FIG. 10 to FIG. 15, a winding core 1a according to a second embodiment of the disclosure and a method for manufacturing the winding cores 1a will be described. In FIG. 10 to FIG. 15 and FIG. 16 to FIG. 28, components corresponding to the components illustrated in FIG. 1 to FIG. 9 are designated by like reference numbers, and a duplicated description is omitted.

Figure 10:
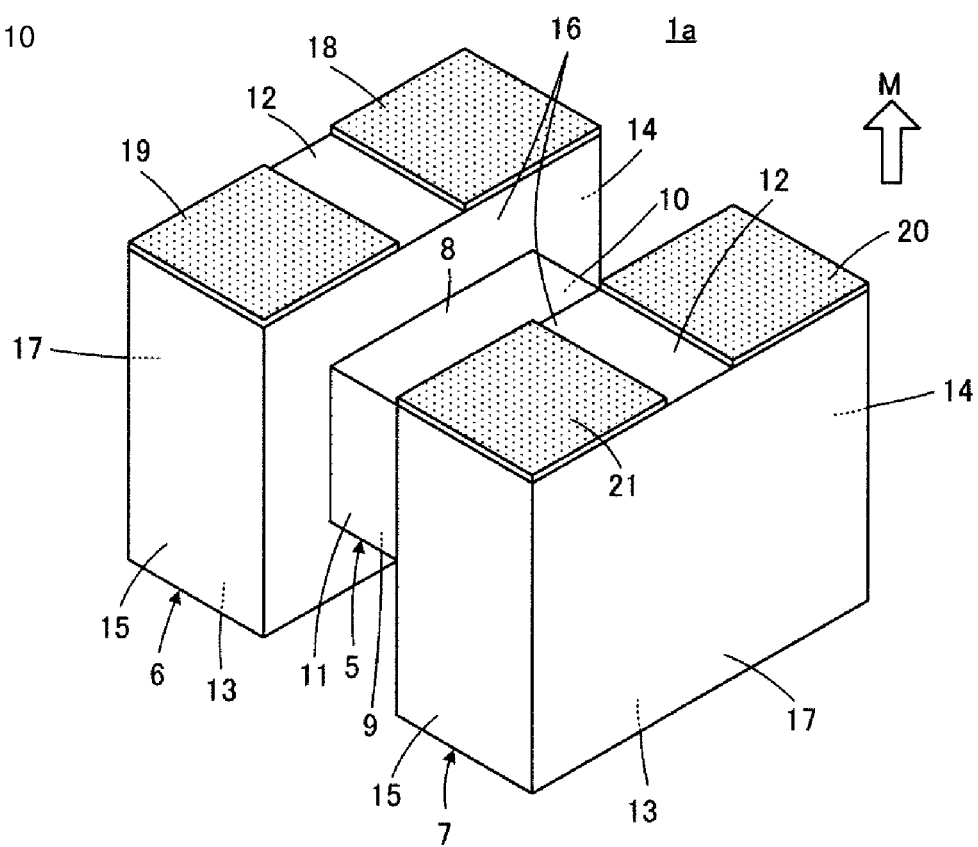
FIG. 10 is a perspective view of a winding core according to a second embodiment of the disclosure with a surface that is to be directed to the mounting substrate side M facing upward.

FIG. 10 illustrates the winding core 1a with a surface that is to be directed to the mounting substrate side M facing upward. The winding core 1a is used to form, for example, a common-mode choke coil as in the winding core 1.

The winding core 1a is characterized in that the positions of the first and second core portion side surfaces 10 and 11 are lower than those of the first and second flange side surfaces 14 and 15 unlike the winding core 1, in other words, the first and second core portion side surfaces 10 and 11 are nearer than the first and second flange side surfaces 14 and 15 to the center axis of the core portion 5.

The following processes are performed to manufacture the winding cores 1a.

Figure 11:
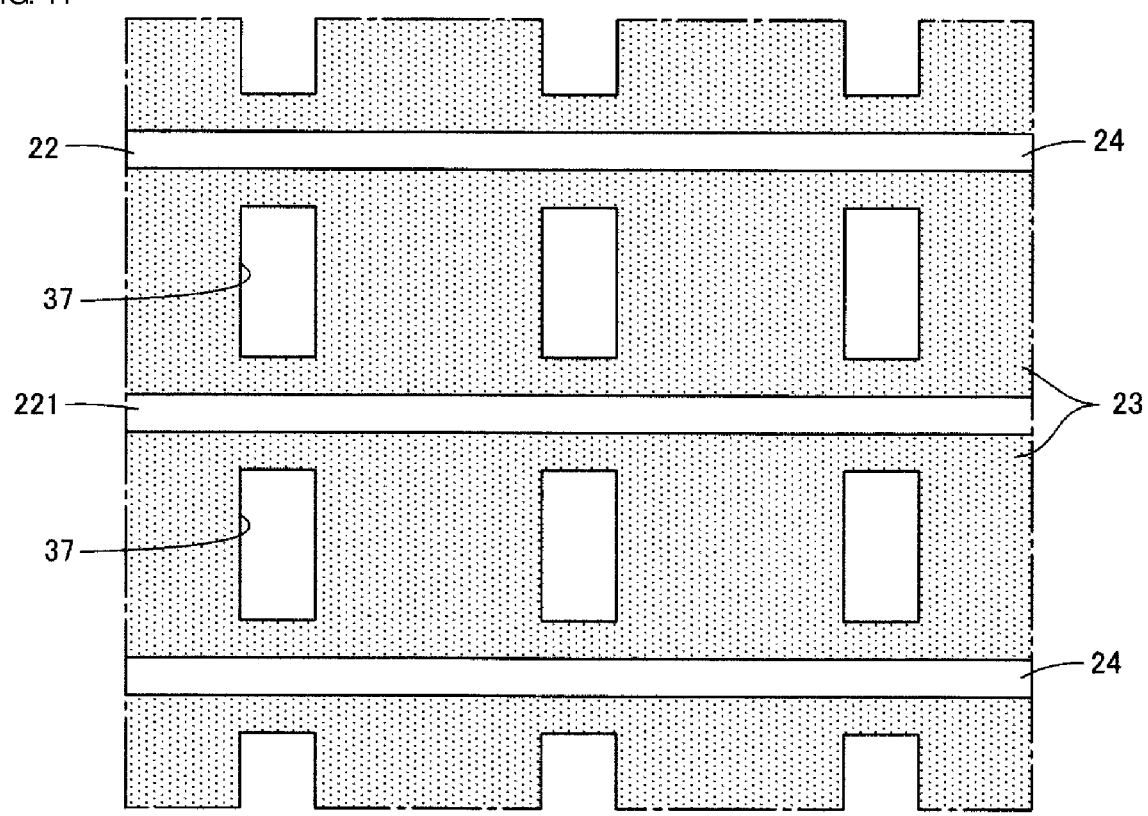
FIG. 11 corresponds to FIG. 3 and illustrates a plan view of a mother substrate that is prepared to manufacture the winding core illustrated in FIG. 10.

FIG. 11 corresponds to FIG. 3 according to the first embodiment. According to the second embodiment, as illustrated in FIG. 11, the mother substrate 22 has prismatic through-holes 37. The through-holes 37 are formed by performing a cutting process or a laser process on the mother substrate 22. The through-holes 37 are formed to locate the first and second core portion side surfaces 10 and 11 at positions lower than the first and second flange side surfaces 14 and 15. Peripheries that define the through-holes 37 also define contours along the first and second core portion side surfaces 10 and 11 and the inner end surfaces 16 of the flanges 6 and 7.

Figure 12:
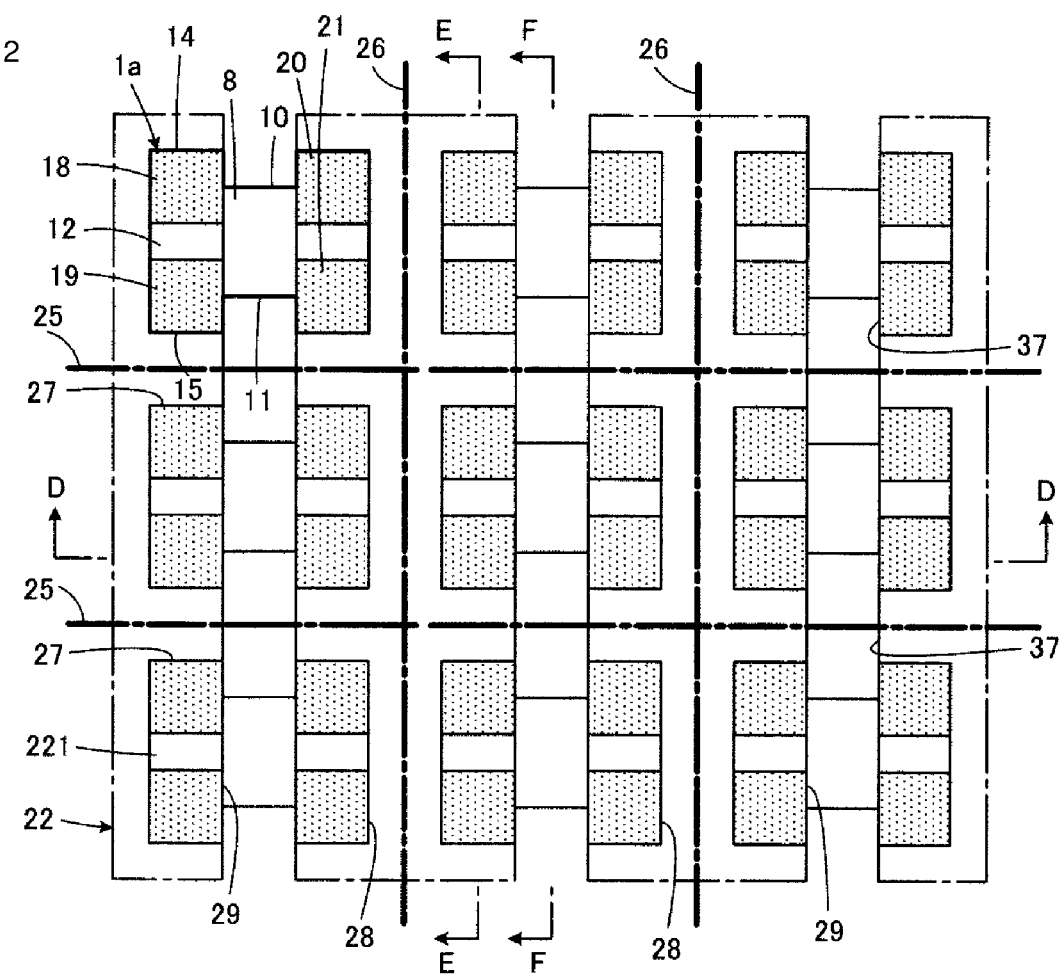
FIG. 12 corresponds to FIG. 4 and illustrates a plan view of a first main surface of the mother substrate illustrated in FIG. 11 on which x-direction division grooves, y-direction division grooves, and bottom surface exposure grooves are formed.

FIG. 12 corresponds to FIG. 4 according to the first embodiment. Subsequently, as illustrated in FIG. 12, the x-direction division grooves 27 are formed along the x-direction division lines 25 on the first main surface 221 of the mother substrate 22, and the y-direction division grooves 28 are formed along the y-direction division lines 26 thereon. The bottom surface exposure grooves 29 that extend in the y-direction are formed on the first main surface 221 of the mother substrate 22 such that the bottom surface exposure grooves 29 are shallower than the x-direction division grooves 27 and the y-direction division grooves 28.

Figure 13:
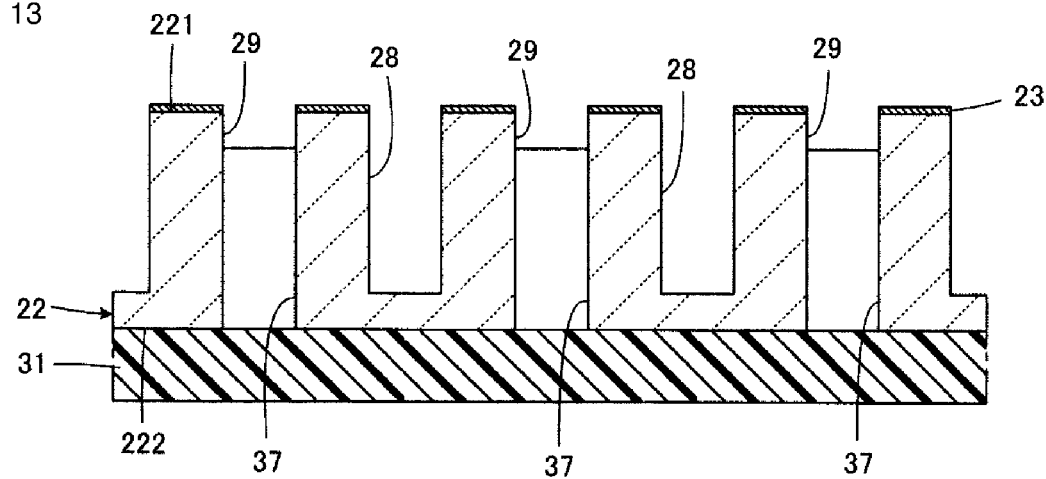
FIG. 13 is a sectional view of FIG. 12 taken along line D-D.
Figure 14:
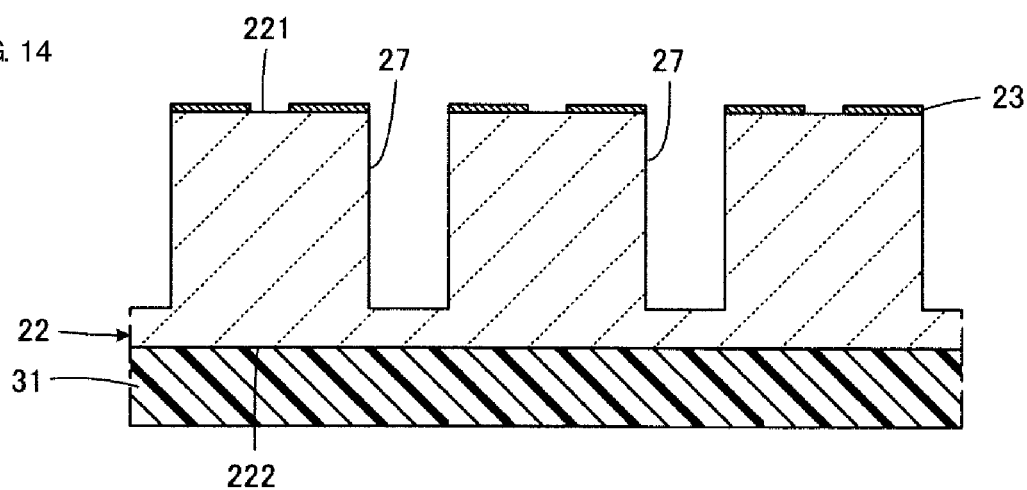
FIG. 14 is a sectional view of FIG. 12 taken along line E-E.
Figure 15:
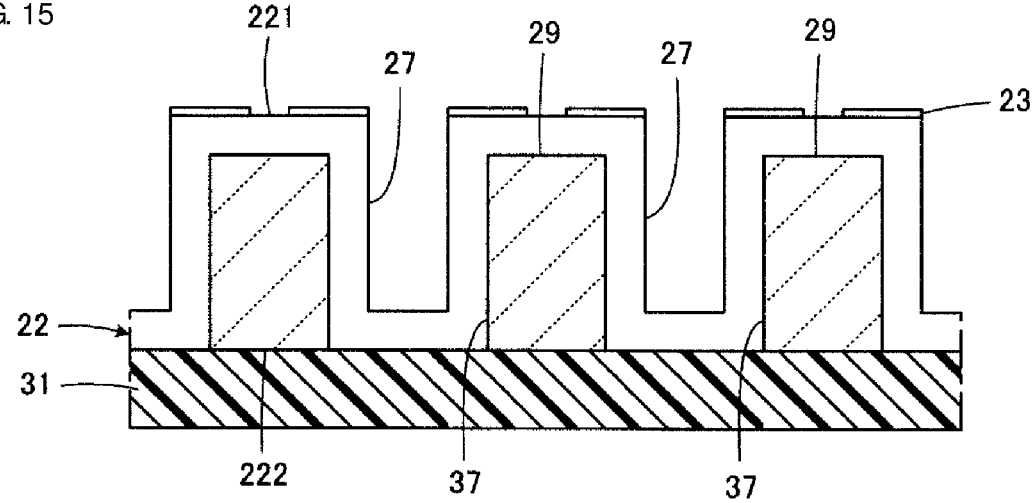
FIG. 15 is a sectional view of FIG. 12 taken along line F-F.

The x-direction division grooves 27 are also illustrated in FIG. 14 and FIG. 15. The y-direction division grooves 28 are also illustrated in FIG. 13. The bottom surface exposure grooves 29 are also illustrated in FIG. 13 and FIG. 15. The through-holes 37 are also illustrated in FIG. 13 and FIG. 15.

In FIG. 12, a portion that is surrounded by thick lines at the upper left is to be one of the winding cores 1a. In this state, the position of the core portion bottom surface 8 of the winding core 1a is lower than that of each flange bottom surface 12, each underlying layer of the terminal electrodes 18 to 21 is formed on the corresponding flange bottom surface 12, and the positions of the core portion side surfaces 10 and 11 are lower than those of the flange side surfaces 14 and 15.

Subsequently, the winding core 1a illustrated in FIG. 10 can be obtained by performing processes corresponding to the processes illustrated in FIG. 7 to FIG. 9 according to the first embodiment.

Third Embodiment

Figure 16:
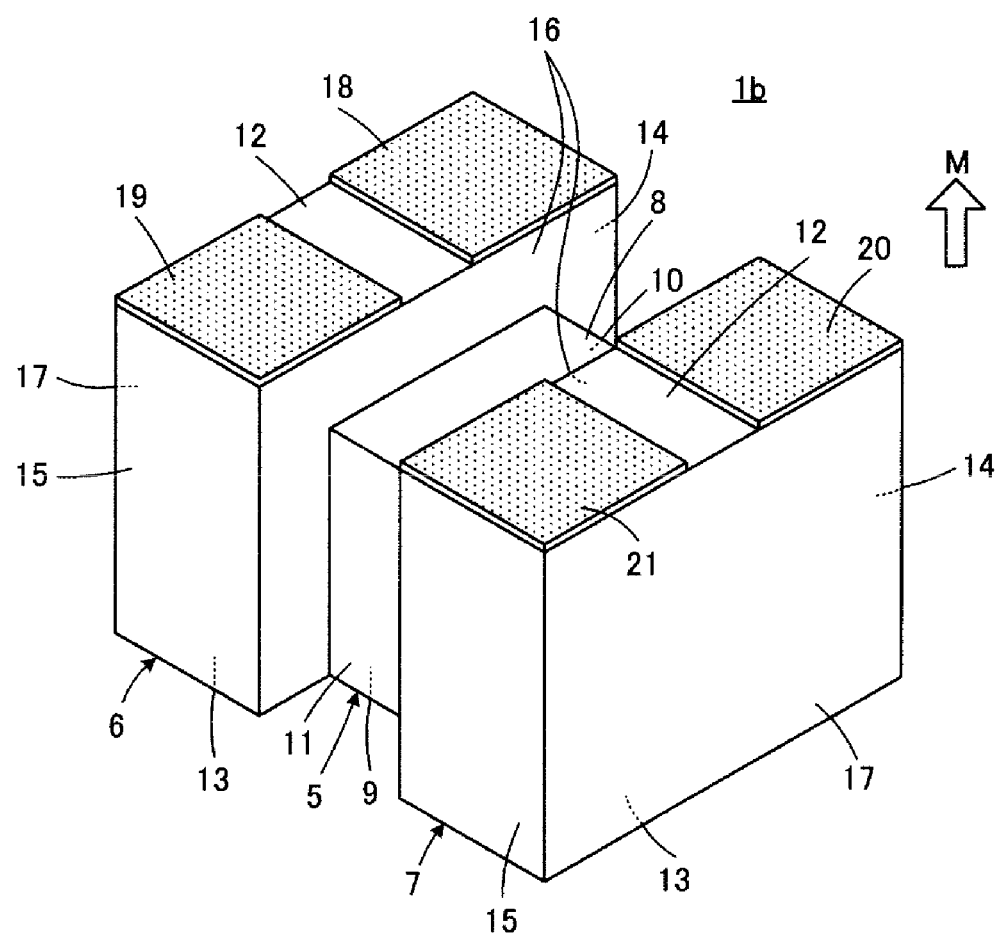
FIG. 16 is a perspective view of a winding core according to a third embodiment of the disclosure with a surface that is to be directed to the mounting substrate side M facing upward.

FIG. 16 illustrates a winding core 1b according to a third embodiment of the disclosure with a surface that is to be directed to the mounting substrate side M facing upward. The winding core 1b is used to form, for example, a common-mode choke coil as in the winding cores 1 and 1a.

The winding core 1b is characterized in that the core portion upper surface 9 is flush with each flange upper surface 13 unlike the winding core 1a according to the second embodiment. The winding core 1b can be obtained in the same manner as the method for manufacturing the winding cores 1a according to the second embodiment except that the process of forming the upper surface exposure grooves 33 illustrated in FIG. 8 according to the first embodiment is omitted.

Fourth Embodiment

Figure 17:
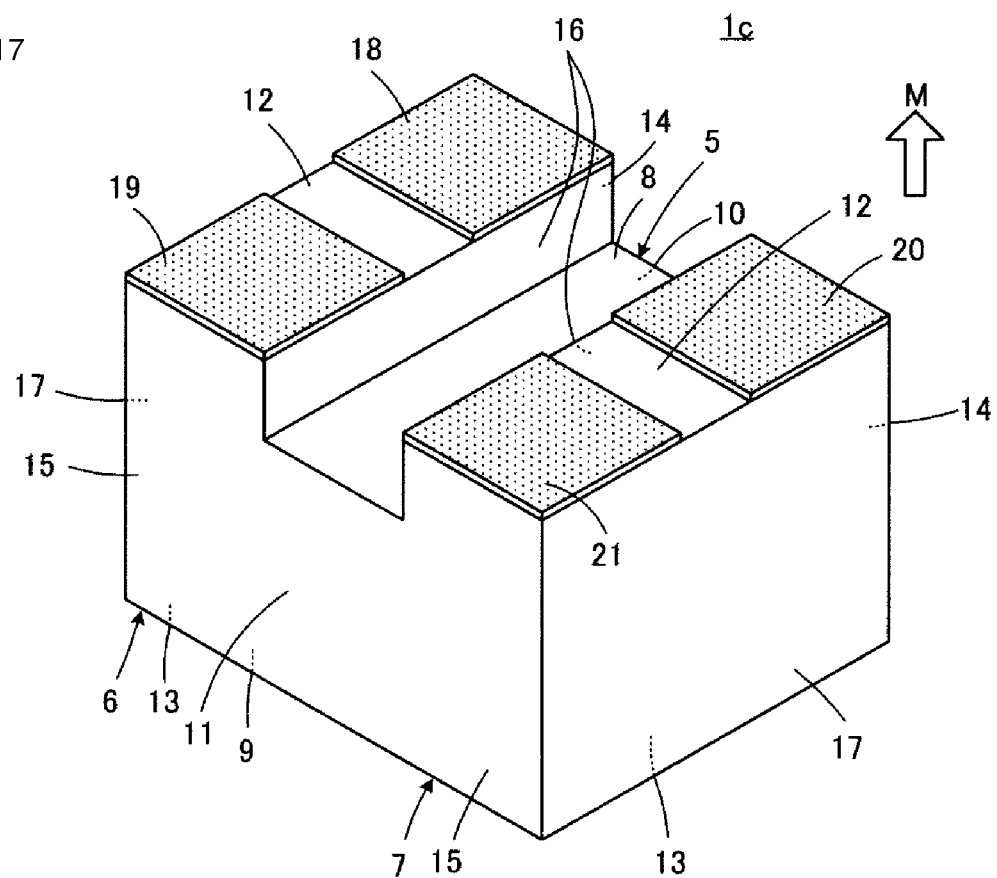
FIG. 17 is a perspective view of a winding core according to a fourth embodiment of the disclosure with a surface that is to be directed to the mounting substrate side M facing upward.

FIG. 17 illustrates a winding core 1c according to a fourth embodiment of the disclosure with a surface that is to be directed to the mounting substrate side M facing upward. The winding core 1c is used to form, for example, a common-mode choke coil as in the winding cores 1, 1a, and 1b.

The winding core 1c is characterized in that the core portion upper surface 9 is flush with each flange upper surface 13 unlike the winding core 1 according to the first embodiment. The winding core 1c can be obtained in the same manner as the method for manufacturing the winding cores 1 according to the first embodiment except that the process of forming the upper surface exposure grooves 33 illustrated in FIG. 8 is omitted.

Fifth Embodiment

Figure 18:
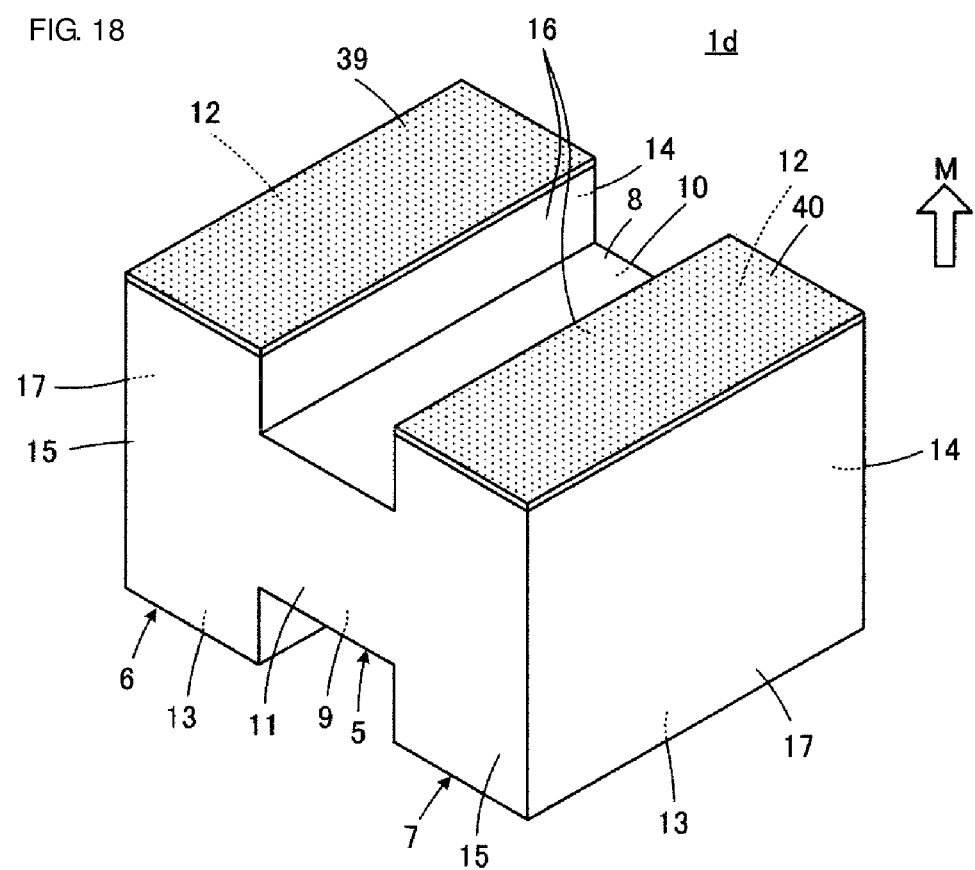
FIG. 18 is a perspective view of a winding core according to a fifth embodiment of the disclosure with a surface that is to be directed to the mounting substrate side M facing upward.

FIG. 18 illustrates a winding core 1d according to a fifth embodiment of the disclosure with a surface that is to be directed to the mounting substrate side M facing upward. The winding core 1d is used to form, for example, a single coil unlike the winding cores 1, 1a, and 1b.

The winding core 1d is characterized in that a terminal electrode 39 is disposed on the first flange 6, and a terminal electrode 40 is disposed on the second flange 7. Accordingly, a single winding wire is wound around the core portion 5 although this is not illustrated. The winding core 1d is substantially the same as the winding core 1 except for the structure of the terminal electrodes.

The following processes are performed to manufacture the winding cores 1d.

Figure 19:
FIG. 19 corresponds to FIG. 3 and illustrates a plan view of a mother substrate that is prepared to manufacture the winding core illustrated in FIG. 18.

FIG. 19 corresponds to FIG. 3 according to the first embodiment. In FIG. 19, a part of the conductor film 23 is omitted to illustrate the mother substrate 22. As illustrated in FIG. 19, the conductor film 23 is formed on the first main surface 221 of the mother substrate 22 without a special patterning process. Subsequently, the winding cores 1d are obtained by performing processes corresponding to the processes illustrated in FIG. 4 to FIG. 9 according to the first embodiment.

Sixth Embodiment

Figure 20:
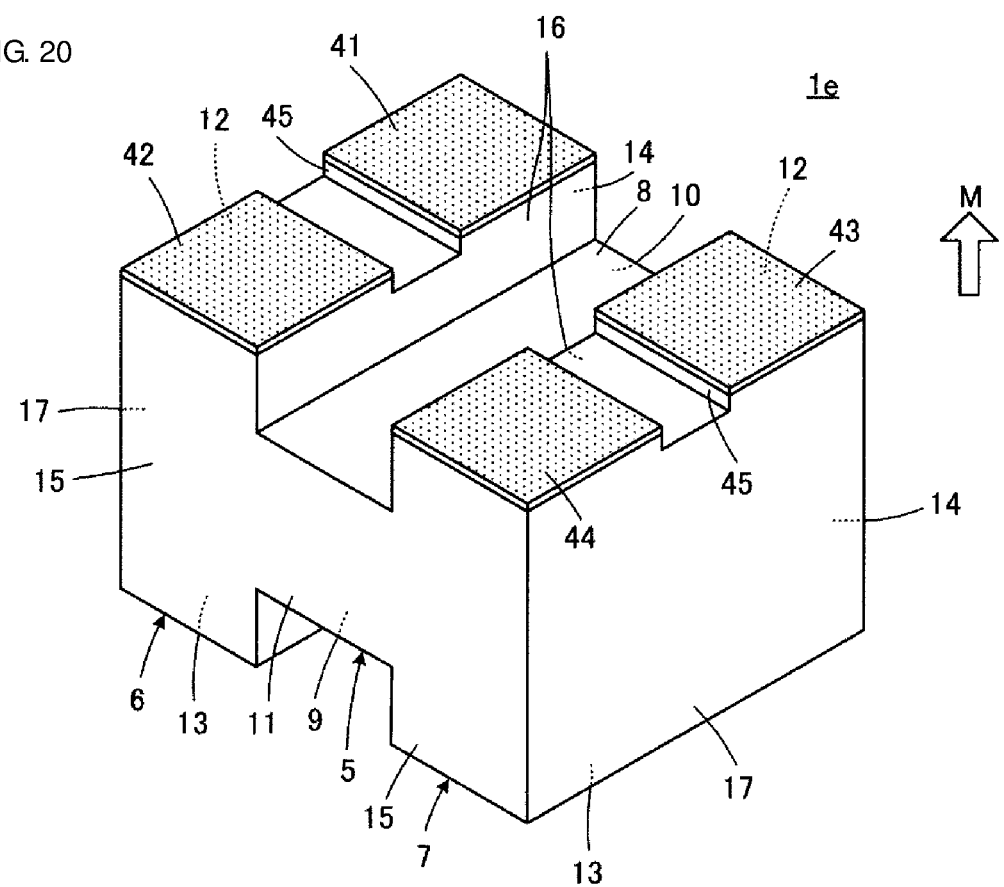
FIG. 20 is a perspective view of a winding core according to a sixth embodiment of the disclosure with a surface that is to be directed to the mounting substrate side M facing upward.

FIG. 20 illustrates a winding core 1e according to a sixth embodiment of the disclosure with a surface that is to be directed to the mounting substrate side M facing upward. The winding core 1e is used to form, for example, a common-mode choke coil as in the winding cores 1, 1a, 1b, and 1c.

In the winding core 1e illustrated in FIG. 20, first and second terminal electrodes 41 and 42 are disposed on the first flange 6. Third and fourth terminal electrodes 43 and 44 are disposed on the second flange 7.

The features of the winding core 1e illustrated in FIG. 20 are made clear by comparison with the winding core 1d illustrated in FIG. 18. That is, the first and second terminal electrodes 41 and 42 in FIG. 20 are obtained by splitting a conductor film that corresponds to the terminal electrode 39 in FIG. 18. The third and fourth terminal electrodes 43 and 44 illustrated in FIG. 20 are obtained by splitting a conductor film that corresponds to the terminal electrode 40 in FIG. 18. Split grooves 45 are formed on the respective flange bottom surfaces 12 for splitting the conductor films.

Figure 21:
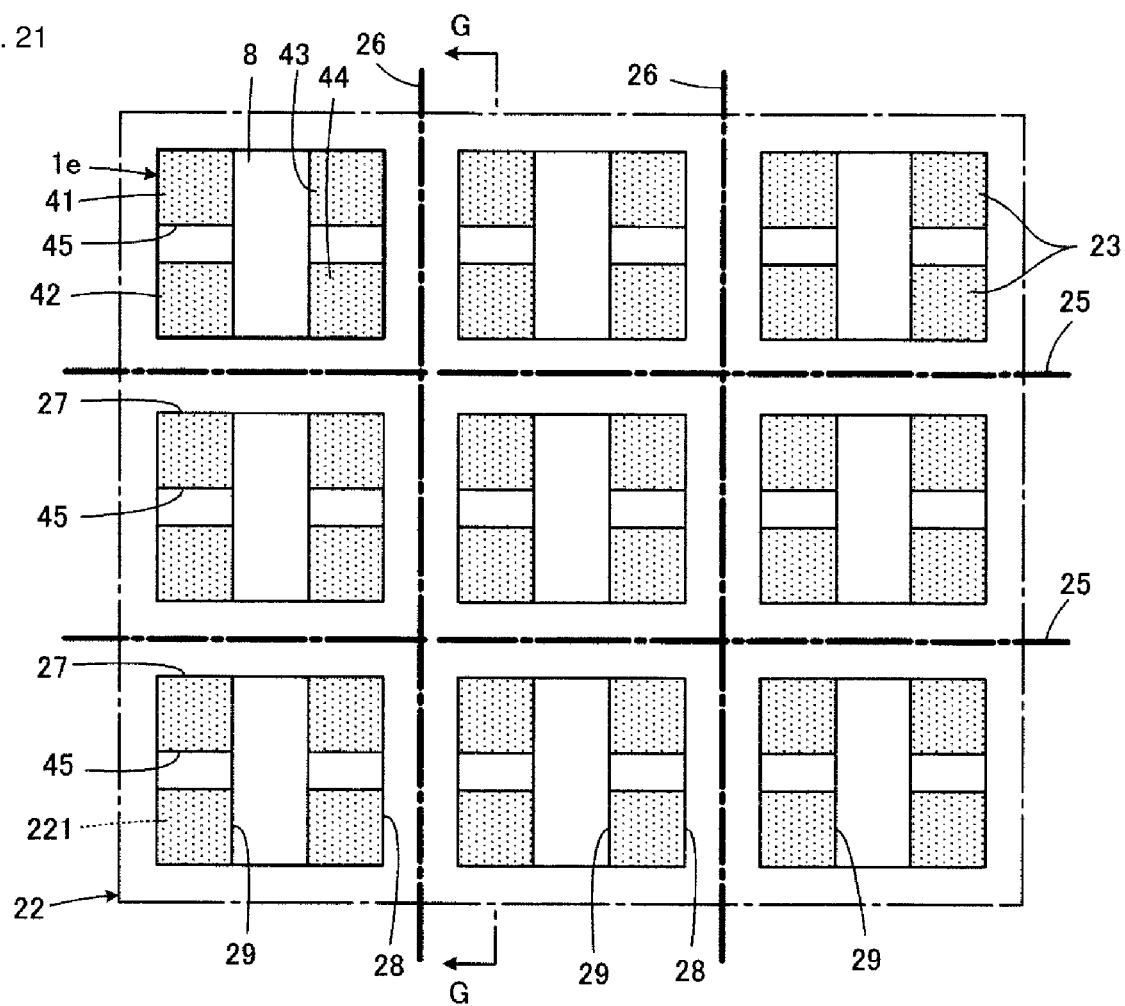
FIG. 21 corresponds to FIG. 4 and illustrates a plan view of a first main surface of a mother substrate that is prepared to manufacture the winding core illustrated in FIG. 20 with x-direction division grooves, y-direction division grooves, bottom surface exposure grooves, and split grooves being formed on the first main surface.
Figure 22:
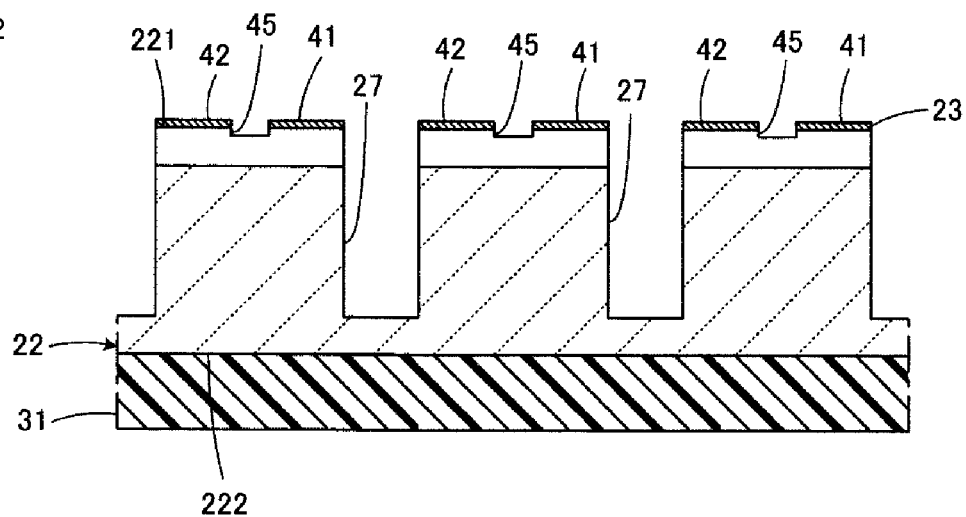
FIG. 22 is a sectional view of FIG. 21 taken along line G-G.

As illustrated in FIG. 21 and FIG. 22, the split grooves 45 are formed with a dicing machine on the first main surface 221 of the mother substrate 22 as it is. The other processes are the same as in the method for manufacturing the winding cores 1d according to the fifth embodiment described with reference to FIG. 18 and FIG. 19.

Seventh Embodiment

Figure 23:
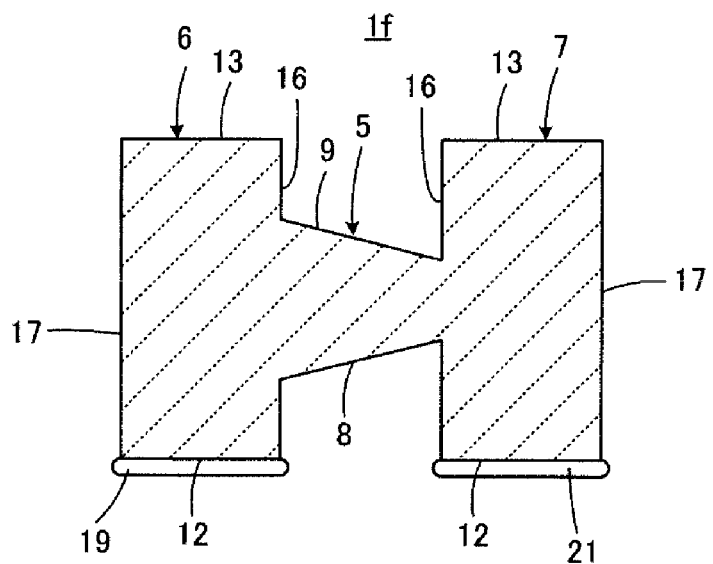
FIG. 23 is a longitudinal sectional view of a winding core according to a seventh embodiment of the disclosure.

FIG. 23 is a longitudinal sectional view of a winding core 1f according to a seventh embodiment of the disclosure. The winding core if according to the seventh embodiment is characterized in that the core portion bottom surface 8 and the core portion upper surface 9 incline with respect to the center axis of the core portion 5.

To obtain the winding cores 1f illustrated in FIG. 23, for example, the process of forming the bottom surface exposure grooves 29 and the upper surface exposure grooves 33 in the method for manufacturing the winding cores 1 according to the first embodiment may be modified as follows.

That is, a dicing machine that includes a blade an end of which obliquely extends, for example, is used in the process of forming the bottom surface exposure grooves 29. This enables the bottom surface exposure grooves 29 to be formed such that the core portion bottom surface 8 inclines with respect to the center axis of the core portion 5. Similarly, a dicing machine that includes a blade an end of which obliquely extends, for example, is used in the process of forming the upper surface exposure grooves 33. This enables the upper surface exposure grooves 33 to be formed such that the core portion upper surface 9 inclines with respect to the center axis of the core portion 5.

Figure 24:
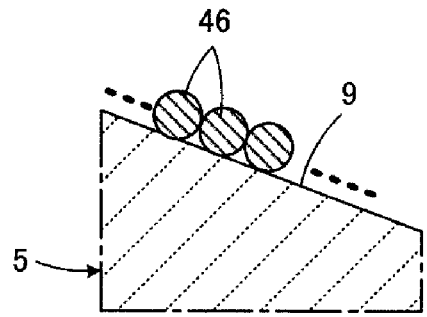
FIG. 24 is a sectional view of a winding wire that is wound around a core portion of the winding core illustrated in FIG. 23 and illustrates a winding state.

In the winding core 1f according to the seventh embodiment, the core portion bottom surface 8 and the core portion upper surface 9 incline. Accordingly, a coil component that includes the winding core 1f can have a decreased distributed capacitance between lines of a winding wire 46 that is spirally wound around the core portion 5 as illustrated in FIG. 24, in which a part of the core portion upper surface 9 is illustrated.

It may be either the core portion bottom surface 8 or the core portion upper surface 9 that inclines with respect to the center axis of the core portion 5.

Eighth Embodiment

Figure 25:
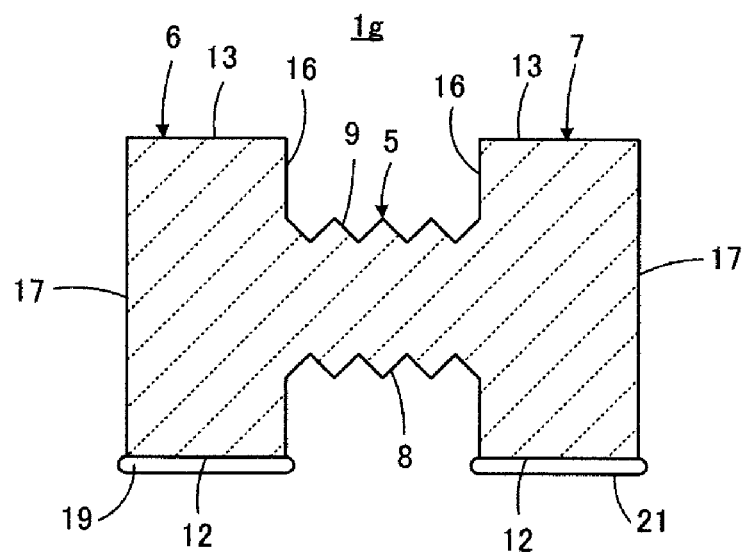
FIG. 25 is a longitudinal sectional view of a winding core according to an eighth embodiment of the disclosure.

FIG. 25 is a longitudinal sectional view of a winding core 1g according to an eighth embodiment of the disclosure. The winding core 1g according to the eighth embodiment is characterized in that the core portion bottom surface 8 and the core portion upper surface 9 have irregularities that are arranged in the direction of the center axis of the core portion 5.

To obtain the winding cores 1g illustrated in FIG. 25, for example, the process of forming the bottom surface exposure grooves 29 and the upper surface exposure grooves 33 in the method for manufacturing the winding cores 1 according to the first embodiment may be modified as follows.

That is, a dicing machine that includes a blade an end of which has irregularities, for example, is used in the process of forming the bottom surface exposure grooves 29. This enables the bottom surface exposure grooves 29 to be formed such that the core portion bottom surface 8 has irregularities that are arranged in the direction of the center axis of the core portion 5. Similarly, a dicing machine that includes a blade an end of which has irregularities, for example, is used in the process of forming the upper surface exposure grooves 33. This enables the upper surface exposure grooves 33 to be formed such that the core portion upper surface 9 has irregularities that are arranged in the direction of the center axis of the core portion 5.

Figure 26:
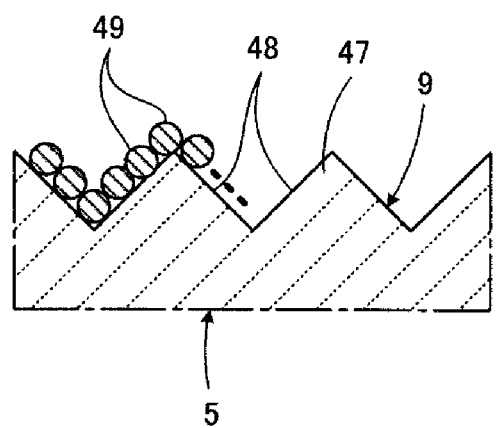
FIG. 26 is a sectional view of a winding wire that is wound around a core portion of the winding core illustrated in FIG. 25 and illustrates an example of the winding state.

In the winding core 1g according to the eighth embodiment, the irregularities are formed in a saw tooth shape. Accordingly, in the case where some lines of a winding wire 49 that is wound at multiple times are arranged on an incline portion 48 of a saw teeth 47 as illustrated in FIG. 26, the distributed capacitance between the lines of the winding wire 49 can be decreased as with the seventh embodiment.

Figure 27:
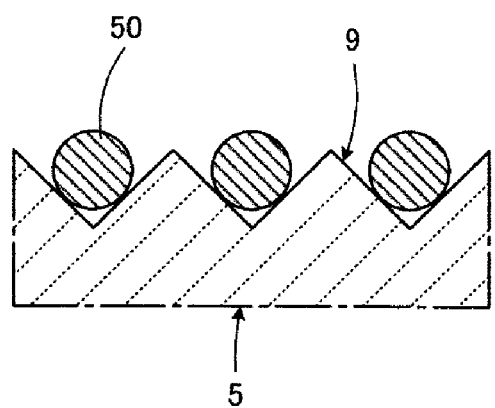
FIG. 27 is a sectional view of the winding wire that is wound around the core portion of the winding core illustrated in FIG. 25 and illustrates another example of the winding state.

Variation in characteristics such as an inductance of a coil component that includes the winding core 1g can be reduced in a manner in which a pitch between lines of a winding wire 50 that is wound around the core portion 5 is determined on the basis of the irregularities as illustrated in FIG. 27. Also, it may be either the core portion bottom surface 8 or the core portion upper surface 9 that has the irregularities that are arranged in the direction of the center axis of the core portion 5.

Ninth Embodiment

Figure 28:
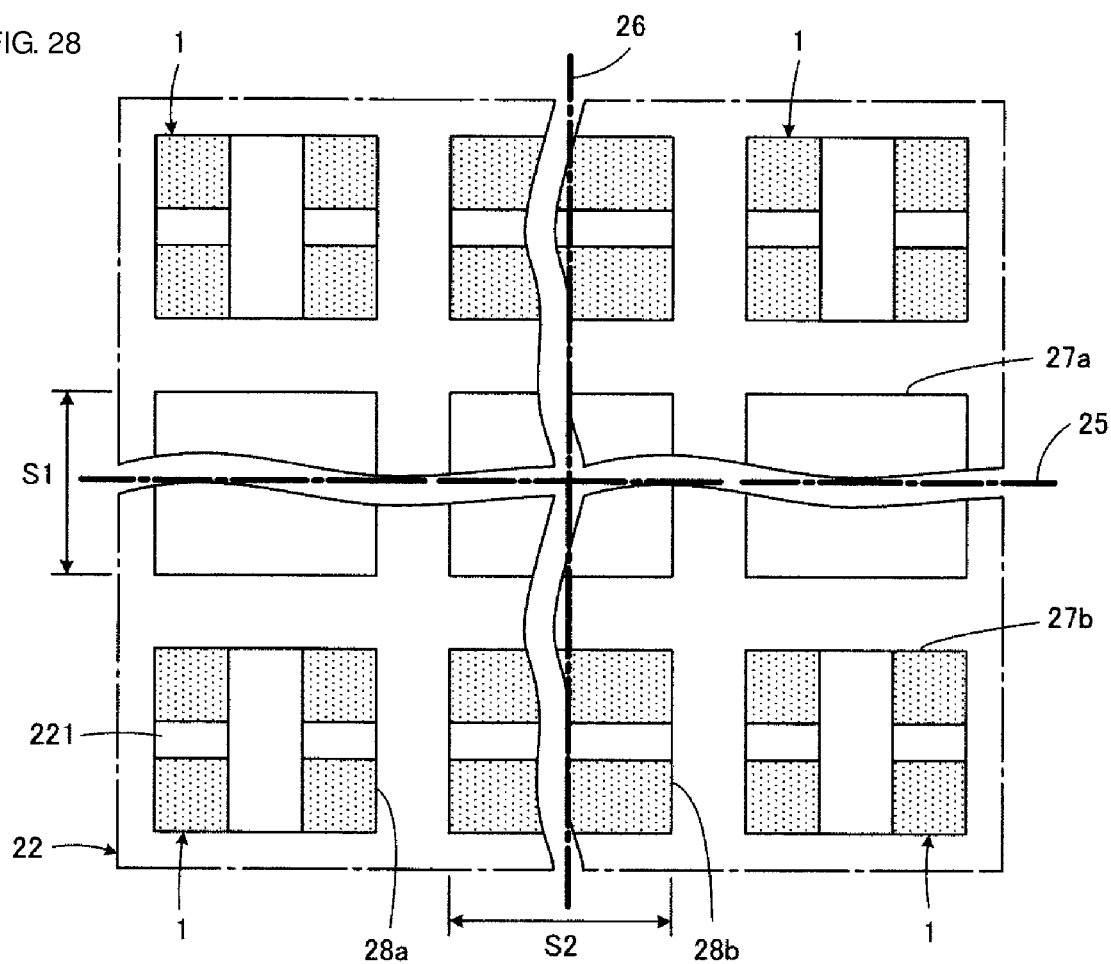
FIG. 28 corresponds to FIG. 4 and illustrates a ninth embodiment of the disclosure with a plan view.

Referring to FIG. 28, a ninth embodiment of the disclosure will be described. FIG. 28 corresponds to FIG. 4 referred to describe the first embodiment.

The ninth embodiment will now be described as a modification to the first embodiment. The ninth embodiment differs from the first embodiment as follows.

According to the ninth embodiment, as illustrated in FIG. 28, two x-direction division grooves 27a and 27b that are parallel to each other are formed along each x-direction division line 25 that partitions regions that are to be the adjoining winding cores 1 on the mother substrate 22. Similarly, two y-direction division grooves 28a and 28b that are parallel to each other are formed along each y-direction division line 26 that partitions regions that are to be the adjoining winding cores 1 on the mother substrate 22.

This manufacturing method enables a pressure that is applied to the mother substrate 22 to spread when the flattening process is performed to divide the mother substrate 22 as illustrated in FIG. 8 and FIG. 9. Consequently, a load that is applied to the region of each winding core 1 as a product decreases, and the winding core 1 as a product is unlikely to break and chip.

A distance S1 between the x-direction division grooves 27a and 27b and a distance S2 between the y-direction division grooves 28a and 28b can be appropriately determined in consideration for practicability of the above effects.

According to the embodiment illustrated, the two x-direction division grooves 27a and 27b that are parallel to each other are formed, and the two y-direction division grooves 28a and 28b that are parallel to each other are formed. However, three or more x-direction division grooves and three or more y-direction division grooves may be formed between the regions that are to be the adjoining winding cores 1.

Although the ninth embodiment is described above as the modification to the first embodiment, the ninth embodiment can be modifications to the other embodiments other than the first embodiment.

Other Embodiments

The disclosure is described above in relation to the illustrated embodiments. Other embodiments can be considered within the scope of the disclosure.

For example, as necessary, an edge process or a deburring process is performed on each winding core by, for example, blasting while scanning, and a hard film is formed of, for example, DLC (Diamond Like Carbon) on a surface of the winding core. These processes can be efficiently performed on the mother substrate as it is.

The features of the different embodiments described above can be partially replaced or combined to carry out the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A method for manufacturing winding cores, each of the winding cores includes
   a core portion that is located at a central portion in a longitudinal direction and around which a winding wire is to be wound, and
   a first and second flanges that are respectively connected to first and second end portions that are opposite each other in the longitudinal direction of the core portion,
   each core portion having a core portion bottom surface that is to be directed to a mounting substrate side during mounting, a core portion upper surface that is opposite the core portion bottom surface, and first and second core portion side surfaces that connect the core portion bottom surface and the core portion upper surface to each other and that face away from each other, each of the first and second flanges having a flange bottom surface that is to be directed to the mounting substrate side and that is to be nearer than the core portion bottom surface to the mounting substrate during mounting, a flange upper surface that is opposite the flange bottom surface, first and second flange side surfaces that are to be perpendicular to the mounting substrate during mounting, that connect the flange bottom surface and the flange upper surface to each other, and that face away from each other, an inner end surface that faces the core portion and on which an end portion of the core portion is disposed, and an outer end surface that is opposite the inner end surface and that faces outward, the method comprising:

preparing a mother substrate that is composed of a non-conductive material and that enables the winding cores to be obtained in a manner in which the mother substrate is divided along x-direction division lines and y-direction division lines that are perpendicular to each other;

forming x-direction division grooves along the x-direction division lines on a first main surface of the mother substrate;

forming y-direction division grooves along the y-direction division lines on the first main surface of the mother substrate;

forming bottom surface exposure grooves to expose, for each of the winding cores, the core portion bottom surface, the inner end surface of the first flange, and the inner end surface of the second flange, on the first main surface of the mother substrate such that the bottom surface exposure grooves are shallower than the x-direction division grooves and the y-direction division grooves; and dividing the mother substrate by performing a flattening process on a second main surface of the mother substrate that is opposite the first main surface until the second main surface reaches the x-direction division grooves and the y-direction division grooves to obtain the winding cores that are separated from each other.

2. The method according to claim 1, wherein
the mother substrate is divided with the mother substrate reinforced from the first main surface.

3. The method according to claim 1, wherein
the x-direction division grooves, the y-direction division grooves, and the bottom surface exposure grooves are formed with a dicing machine.

4. The method according to claim 1, wherein
the forming the bottom surface exposure grooves includes forming the bottom surface exposure grooves such that the core portion bottom surface inclines with respect to a center axis of the core portion.

5. The method according to claim 1, wherein
the forming the bottom surface exposure grooves includes forming the bottom surface exposure grooves such that the core portion bottom surface has irregularities that are arranged in a direction of a center axis of the core portion.

6. The method according to claim 1, further comprising:
forming upper surface exposure grooves, for exposing surfaces each of which is to be the core portion upper surface, on the second main surface of the mother substrate at positions at which the upper surface exposure grooves are lined up with the bottom surface exposure grooves such that a position of the core portion upper surface is lower than that of the flange upper surface before the mother substrate is divided.

7. The method according to claim 6, wherein
the upper surface exposure grooves are formed with a dicing machine.

8. The method according to claim 6, wherein
the forming the upper surface exposure grooves includes forming the upper surface exposure grooves such that the core portion upper surface inclines with respect to a center axis of the core portion.

9. The method according to claim 6, wherein
the forming the upper surface exposure grooves includes forming the upper surface exposure grooves such that the core portion upper surface has irregularities that are arranged in a direction of a center axis of the core portion.

10. The method according to claim 1, further comprising:
forming through-holes, for locating the first and second core portion side surfaces at positions lower than the first and second flange side surfaces, in the mother substrate before the mother substrate is divided.

11. The method according to claim 1, wherein each winding core further includes at least one first terminal electrode that is disposed on the flange bottom surface of the first flange and at least one second terminal electrode that is disposed on the flange bottom surface of the second flange, and the method further comprises forming conductor films that are to be the at least one first terminal electrode and the at least one second terminal electrode on the first main surface of the mother substrate before the mother substrate is divided.

12. The method according to claim 11, wherein
the forming the conductor films includes forming the conductor films on the first main surface of the mother substrate such that each conductor film has a shape following a shape of a corresponding one of the flange bottom surfaces of the at least one first terminal electrode and the at least one second terminal electrode.

13. The method according to claim 12, further comprising:
substantially stripe shaping along the x-direction to divide each of the conductor films.

14. The method according to claim 11, wherein
the forming the conductor films includes forming the conductor films on the first main surface of the mother substrate and subsequently removing parts of the conductor films such that each conductor film has a shape following a shape of a corresponding one of the flange bottom surfaces of the at least one first terminal electrode and the at least one second terminal electrode.

15. The method according to claim 14, wherein
the removing the parts of the conductor films includes forming a split groove on the first main surface of the mother substrate with a dicing machine such that the conductor films are separated from each other.

16. The method according to claim 15, wherein
the split groove is formed to extend in the x-direction and to be shallower than the bottom surface exposure grooves.

17. The method according to claim 11, further comprising:
    forming plating layers on the conductor films by electroplating with the conductor films used as underlying layers before the mother substrate is divided.

18. The method according to claim 1, wherein
the forming the x-direction division grooves includes forming at least two x-direction division grooves that are parallel to each other along each of the x-direction division lines that partitions regions that are to be the adjoining winding cores on the mother substrate, and
the forming the y-direction division grooves includes forming at least two y-direction division grooves that are parallel to each other along each of the y-direction division lines that partitions regions that are to be the adjoining winding cores on the mother substrate.

19. The method according to claim 1, wherein
the nonconductive material of which the mother substrate is composed is ceramics, and the ceramics is fired.

* * * * *